(12) United States Patent
Bidan et al.

(10) Patent No.: US 7,829,927 B2
(45) Date of Patent: Nov. 9, 2010

(54) POLYOXOMETALLATES IN MEMORY DEVICES

(75) Inventors: Gérard Bidan, Grenoble (FR); Eric Jalaguier, St Martin d'uriage (FR)

(73) Assignee: Commissariat a l'Energie Atomique, Paris (FR)

(*) Notice: Subject to any disclaimer, the term of this patent is extended or adjusted under 35 U.S.C. 154(b) by 118 days.

(21) Appl. No.: 11/997,706

(22) PCT Filed: Aug. 2, 2006

(86) PCT No.: PCT/FR2006/001882

§ 371 (c)(1),
(2), (4) Date: Feb. 1, 2008

(87) PCT Pub. No.: WO2007/015010

PCT Pub. Date: Feb. 8, 2007

(65) Prior Publication Data

US 2008/0191256 A1 Aug. 14, 2008

(30) Foreign Application Priority Data

Aug. 2, 2005 (FR) .................................. 05 08263

(51) Int. Cl.
*H01L 27/108* (2006.01)
*H01L 21/8242* (2006.01)

(52) U.S. Cl. .............................. 257/298; 257/E21.209; 257/E21.646; 257/E27.084; 257/E29.302; 257/E29.309; 257/316; 257/317; 257/314; 257/315

(58) Field of Classification Search ................. 257/298, 257/314, 315, 316, 317, E21.209, E21.646, 257/E27.084, E29.302, 29.309
See application file for complete search history.

(56) References Cited

U.S. PATENT DOCUMENTS

| 4,816,749 | A | 3/1989 | Schmidtpott et al. |
| 5,548,052 | A * | 8/1996 | Katsoulis et al. .............. 528/10 |
| 5,563,016 | A | 10/1996 | Baur et al. |
| 7,579,242 | B2 * | 8/2009 | Bhattacharyya ............. 438/264 |
| 2003/0027052 | A1 * | 2/2003 | Huang et al. ................ 429/304 |
| 2003/0040197 | A1 * | 2/2003 | Cho .......................... 438/785 |
| 2003/0111670 | A1 | 6/2003 | Misra et al. |
| 2005/0162895 | A1 | 7/2005 | Kuhr et al. |

OTHER PUBLICATIONS

IEEE ElectronDevice Letter, © 2000, B. Eitan et al., vol. 21: Issue 11: pp. 543-545.
Judenstein et al., Advanced Materials for Optics and Electronics, © 1997, vol. 7, pp. 123-133.
Angew. Che, Int. Ed. © 2005: 44, pp. 1254-1257.
C. Mayer, et al. Chemical Materials © 2000: vol. 12, pp. 257-260.
B. Phillips, Vac. Sci, Technologies A, © 1983, A1 646.
International Technology Roadmap for Semiconductors © 2004 (ITRS 2004) (http://www.itrs.net/common/2004_udpdate/2004update.html).
IEEE Non-Volatile Semiconductor Memo Workshop, M. Sadd et al., © 2003, p. 71.

(Continued)

*Primary Examiner*—Matthew E Warren
*Assistant Examiner*—David Spalla
(74) *Attorney, Agent, or Firm*—Miller, Matthias & Hull

(57) ABSTRACT

The invention relates to a DRAM memory device with a capacity associated with a field effect transistor, in which all or some of the molecules capable of storing the loads comprising a polyoxometallate are incorporated into the capacity, or a flash-type memory using at least one field effect transistor, in which the molecules capable of storing the loads comprising a polyoxometallate are incorporated into the floating grid of the transistor. The invention also relates to a method for producing on such device and to an electronic appliance comprising one such memory device.

27 Claims, 19 Drawing Sheets

OTHER PUBLICATIONS

Applied Physics Letters, Li et al., © 2004 vol. 84: pp. 1949-1951.
Ganguly et al., Mat.Res.Soc.Symp.Proc., ©2004 vol. 789: pp. 403-405.
A. Yasseri et al., J. American Chemical Society, © 2004 vol. 126: pp. 15603-15612.
Q. Li et al., Advanced Materials, © 2004 vol. 16: pp. 133-137.
Q. Li et al., Journal of Physical Chemistry, © 2004, vol. 108: pp. 9646-9648.
Kuhr et al., MRS Bulletin, © 2004 vol. 11, pp. 838-842.
Kuhn et al., J. of Electroanalytical Chemistry, © 1999, pp. 187-194.
G. Bidan et al., Journal of Electroana. Chem., vol. 251 © 1988: pp. 297-306.
E. Coronado and C. Mingotaud, Langmuir-Blodgett Films, Advanced Materials.
G. Decher, et al., Science, vol. 277, © 1997, pp. 1232-1237.
S. Liu, et al., Journal of American Chemical Society, © 2002, vol. 124, pp. 12279-12287.
D. Ingersoll et al., J. Electrochem, Soc., Vo. 141, No. 1, © 1994, pp. 141-146.
L. Cheng and S. Dong Electrochemistry Communications 1, © 1999, pp. 159-162.
S. Bareyt et al., J. American Chemical Society, © 2005, vol. 127, pp. 6788-6794.
T. McCormac, et al., Journal Electroanalytical Chemistry 425, © 1997, pp. 49-54.
B. Keita et al., J. Electroanalytic Chemistry, © 1988, 247, 157.
Glezos et al., Applied physics letters, Vo. 83, No. 3, © 2003, pp. 488-490.
Liu et al. Advanced Materials, vol. 14, No. 3, © 2002 pp. 225-228.
Bai et al., Advanced Materials, vol. 14, No. 21 © 2002, pp. 1546-1549.
Clemente-Leon et al., Elsevier Science, vol. 327-329, © 1998, pp. 439-442.
Chaidogiannos et al., Elsevier, vol. 73-74, © 2004, pp. 746-751.

\* cited by examiner (a)

(b)

(a)

(b)

(c)

(a)

(b)

(c)

(a) (b)

POLYOXOMETALLATES IN MEMORY DEVICES

CROSS-REFERENCE TO RELATED APPLICATIONS

This application is a U.S. national stage filing of International Patent Application No. PCT/FR2006/001882 filed on Aug. 2, 2006, which claims priority under the Paris Convention to French Patent Application No. 05 08263, filed on Aug. 8, 2005.

FIELD OF THE DISCLOSURE

The present invention relates to a charge storage memory device, its fabricating process and its use in the field of electronics.

BACKGROUND OF THE DISCLOSURE

Memory devices are present in all electronic systems for storing data. The base components which form them, the memory cells, are still the subject of intense research to improve their performance (retention, reliability, programming speed) especially by means of so-called innovative memory. The term "innovative" is understood to mean that they use storage mechanisms that until now have not been exploited in the field of electronics or else that they are novel in their architectures.

In the design of nonvolatile memory devices the following are sought: a high capacity, greatly reduced access times and a high data rate. The capacity represents the volume of information (generally expressed in bits) that the memory can store. The access time corresponds to the time interval between the read/write request and the availability of data. The data rate defines the volume of information exchanged per unit of time, expressed in bits per second. The "nonvolatility" characterizes the ability of a memory to retain the data when it is no longer powered.

Several types of memory exist. Random access memory, generally called RAM, especially including DRAM memory (dynamic random access memory), is of volatile type as it enables data to be stored only when it is powered. Read-only memory, called ROM, is nonvolatile and makes it possible to retain information which is contained therein even when it is no longer powered. Flash memory possesses the nonvolatility of read-only memory while being easily accessible when reading or writing. The name "flash" comes from the fact that the memory erasing operations are very rapid (about 10 s/byte).

Flash memory was designed so that an individual memory cell could be electrically programmed individually, and that a large number of individual cells, called a block, sector or page, could be electrically erased at the same time. Flash memory simultaneously combines the high density of EPROM memory (Erasable Programmable Read-Only Memory) and the system electrical erasing of EEPROM (Electrically Erasable Programmable Read-Only Memory).

There are two different flash memory technologies that are differentiated by the organization of their memory networks: the NOR and NAND architectures. NOR architecture provides an assembly of individual memory cells in parallel with selection lines as in a conventional EEPROM. NAND architecture provides an assembly, in series, of the same individual cells with the selection lines. The two NOR and NAND architectures both exploit the same principle of charge storage in the floating gate of a field-effect transistor.

The expression "floating gate" denotes an additional electrically isolated gate having a charge storage role. It is generally located between the channel and the control gate (FIG. 1). In MOS (Metal Oxide Semiconductor) technology, the floating gate is typically made of n-doped polycrystalline silicon (or polysilicon).

The operating principle of so-called floating gate semiconductor memory such as flash memory is to increase the threshold voltage Vth of certain transistors beyond the supply voltage in order to render them nonconductive during read cycles. The points corresponding to transistors with increased threshold voltages will therefore be in the "1" state (written or programmed state), the other in the "0" state (erased state).

The writing step corresponding to the increase in the threshold voltage is obtained by injection of electrons into the floating gate. The writing may be carried out according to two different mechanisms. The first consists of writing by Fowler-Nordheim tunneling. This is a question of applying a high positive voltage (between 10 and 20 V) to the control gate while keeping the drain and the source grounded. The electrons of the channel then tunnel through the tunnel dielectric and charge the floating gate. The second mechanism consists in writing by hot carrier injection. A high positive voltage is still applied to the gate, and also to the drain (drain voltage $V_D$~control gate voltage $V_{CG}/2$), the source being kept grounded. The drain voltage then induces a strong electric field in the channel which allows the electrons to acquire a high enough energy to overcome the energy barrier that constitutes the tunnel dielectric and therefore charge the floating gate. Since writing by Fowler-Nordheim tunneling is quite slow (of the order of a millisecond), it is carried out by a block of cells. Since writing by hot carrier injection is itself faster, but consumes more energy, it allows selective access to a single memory point. The charge stored in this floating gate therefore induces a shift in the $I_D$ ($V_{CG}$) characteristic (drain current $I_D$ as a function of the control gate voltage $V_{CG}$) of the transistor, Reading is carried out by applying a voltage to the control gate between the two threshold voltages—$V_{th1}$ of the "erased" state and $V_{th2}$ of the "written" state (FIG. 2). The erasing operation consists in removing the electrons stored in the floating gate by applying a negative voltage to the control gate. The mechanism used for electrical erasure of floating gate structures is Fowler-Nordheim tunneling. This erasure may be carried out via the channel, via the source or else via both the source and the channel. The performance of nonvolatile memories, especially including flash memories, must meet certain functionality and reliability criteria. In particular, the programmed information must be retained for a period of at least ten years. Furthermore, the endurance of current flash memory must achieve $10^5$ to $10^6$ write/read cycles without variation between the two threshold voltages, $V_{th1}$ of the "erased" state and $V_{th2}$ of the "written" state.

Memory capacity has not ceased to increase despite the miniaturization of the individual cells of memory devices. However, several technological obstacles oppose the ever-increasing miniaturization of memory devices. Thus, the reduction in the dimensions of memory devices is accompanied by a reduction in the thicknesses of the dielectrics, in particular of the gate oxide. It is furthermore expected that by 2007, the thicknesses of tunnel oxide will be 8-9 nm for NOR gates and 6-7 nm for NAND gates (source: International Technology Roadmap for Semiconductor 2004 (ITRS 2004) [http://www.itrs.net/Common/2004Update/2004Update-.htm].). However, to reduce the thickness of the tunnel oxide, in particular to below 8 nm, causes larger leakage currents. These leakage currents are induced either by direct tunneling, or by defects in the oxide that result from repeated writing and erasing operations (SILC for "Strain Induced Leakage Current") The integrity of the programmed information is therefore affected thereby.

RAM memory is capable, thanks to its CMOS (complementary MOS) architecture, of operating at voltages of around 1 to 2 V. On the other hand, flash memory requires much higher usage voltages. In order to reduce the energy consumption, it would therefore be particularly advantageous to develop memory devices which would be capable of operating at voltages almost identical to those of CMOS transistors.

In order to meet the growing demand for miniaturization and improvement in the properties of memory devices (reduced consumption, high capacity with greatly reduced access time, high data rates, retention), novel architectures and novel materials are currently being studied.

Mention may especially be made of the adaptation of the FinFET architecture whose double-gate transistor has a flash functionality (S. Jacob et al., Proceedings of IEEE 1st International Conference on Memory Technology and Design, 153-156, 2005, May 21-24, Giens, France).

It has also been proposed to retain the flash architecture and to incorporate discrete trapping sites within the floating gate. The discrete trapping sites have the advantage of being electrically isolated from one another. Two main types of memory with discrete storage sites are currently known:

Nitride memory of SONOS (Silicon Oxide Nitride Oxide Silicon) type or of NROM (Nitride ROM) type, in which the electrons are trapped in defects located in a layer of silicon nitride ($Si_3N_4$) (B. Eitan et al., *IEEE Electron Device Letters*, 2000, 21:11:543-545). This type of memory advantageously has a high trapping site density (of the order of $10^{13}/cm^2$). However, the injection of electrons into the nitride layer by the control gate during the erasing phase leads to a saturation of the erasing characteristics (M. Sadd et al, IEEE Nonvolatile Semiconductor Memory Workshop 2003, p. 71).

Silicon nanocrystal memory has also been developed. The nanocrystals, whose size varies approximately from 5 to 10 nm, constitute discrete trapping sites. However, such memory is obtained by complex processes which limit the future miniaturization thereof.

The use of organic compounds having redox properties as discrete trapping sites in a floating gate of a flash memory seems to be a promising alternative to the use of conventional semiconductors. In order to be adapted to such a use, the organic compounds must imperatively fulfill the same requirements as those of the semiconductor materials, especially including being thermally stable in order to withstand the very high temperatures used during the manufacture of the memory cells or during their use.

Molecular memory of flash type that is already known uses floating gates comprising redox organic compounds which are oxidized electrostatically or electrochemically (US 2003/0111670 A1). The redox reactions of the organic compounds are controlled either by faradaic charge transfer, or by tunneling. This control makes it possible to modulate the capacity of the floating gate and therefore the threshold voltage of the transistor.

Li et al. (*Appl. Phys. Lett.*, 2004, 84: 1949-1951) describe a memory cell of MOS transistor type comprising an $In_2O_3$ nanowire as the channel, a back control gate, and organic compounds as the floating gate. The compounds used are $Fe^{2+}$ terpyridine complexes. The electrical properties of this memory cell correspond to an on/off ratio greater than $10^4$, a functionality of three bits per cell (eight levels, due to three oxidation states) and a charge retention of 600 h. Other organic compounds such as fullerenes (Ganguly et al., *Mat. Res. Symp. Proc.*, 2004, 789: 403-403) or metal complexes, especially including porphyrins (A, Yasseri et al., *J. Amer. Chem. Soc.*, 2004, 126: 15603-15612), silicon-bridged metallocenes (Q. Li et al., *Adv. Mat.*, 2004, 16: 133-137), or $In_2O_3$-bridged porphyrin (C. Li et al., *J. Phys. Chem.*, 2004, 108: 9646-9649) have also been used in molecular memory. The latter have shown properties similar to that of Li et al.

Mixed self-assembled monolayers (SAMs) comprising zinc porphyrins and ferrocenes as charge storage molecules have been used in capacitor test cells (Q, Li et al., *Advanced Materials*, 2004, 16: 2, 133-137). These compounds have very different structures and their homogeneous distribution within the SAxs is difficult to control. Furthermore, the immobilization on a surface of a semiconductor or of the oxide by a SAM process is itself long, expensive and remains not very reproducible in terms of thickness and homogeneity of the layers. The SAMs obtained by a silanization step give rise to secondary polymerization reactions.

The term "self-assembled" denotes the spontaneous formation of complex hierarchical structures from simple elements. The self-assembling operation is based on the formation of SAM, LbL or Langmuir-Blodgett films. The forces involved in this operation are of supramolecular type, especially including van der Waals forces, dipolar forces and hydrogen bonds.

US 2003/111670 describes flash memory devices using, as charge storage molecules, various compounds with redox properties.

US 2005/162895 also describes memory devices, in particular of DRAM type, that use, as charge storage molecules, various compounds with redox properties.

Chaidogiannos et al. in Microelectronic Engineering, Vol. 73-74, (2004/06) pp. 746-751 and Glezos et al. in Applied Physics Letters, Vol. 83, No. 3, (2004/07/21) pp. 488-490 describe blends of polymers and of polyoxometallates as electronic charge carrier molecules.

Liu et al. describe, in Advanced Materials, Vol. 14, No. 3, Feb. 5, 2002 pp. 225-228, the use of polyoxometallates in an electrochromic device and study the optical stability effects of a multilayer assembly. They measure the color change due to changes in the redox state of particular polyoxometallates based on europium. The devices described do not make it possible to directly produce variations in the amounts of charge sufficient to obtain an electrical memory effect that can be used in DRAM and flash memory applications. It would be necessary, for example, for this purpose to couple them to a reading device so that they could perhaps constitute an electrical memory.

US-A-2003/0111670 describes a memory device of capacitive type comprising charge storage molecules, mainly of the porphyrin family, which are incorporated into a field-effect transistor between the channel and the control gate and which act as a floating gate. The molecules are grafted onto the channel and are encapsulated by an electrolyte, which acts as a control dielectric.

US-A-2005/0162895 describes memory devices and arrays of capacitive type comprising charge storage molecules mainly from the porphyrin family. The charge storage molecule device comprises an electrochemical cell forming a capacitor composed of two electrodes separated by an electrolyte and charge storage molecules encapsulated in an electrolyte coupled electronically to one of the two electrodes.

One of the main problems presented by the memory cells of the prior art is that they use organic compounds which are unstable, especially at high temperatures.

Specifically, it will be recalled that the organic compounds used in the memory cells of the prior art and which have redox properties are thermally unstable. For example, macrocyclic complexes, especially porphyrins or phthalocyanines, retain redox properties up to temperatures reaching 400° C. in an inert atmosphere, but begin to degrade from 200° C. The relative thermal stability of the compounds of the prior art confines their use to what are called back-gate transistors, whereas the fabricating processes of CMOS technologies favor front-gate transistors. This is because these processes involve the deposition of an oxide layer then of the gate onto the molecular layer at temperatures greater than 400° C.

The thermal instability which characterizes the organic compounds of the prior art poses a serious problem during the design of multibit storage memory cells. This is because the mixtures of organic compounds of different families having different degradation kinetics lead to modifications in the distribution of the compounds when very high temperatures are reached.

In particular, a memory device, especially of DRAM type, comprising a capacitor combined with a field-effect transistor, or of flash type and using at least one field-effect transistor, comprising organic compounds that are thermally stable and that have redox properties is not known.

SUMMARY OF THE DISCLOSURE

The present invention aims to improve the situation. It provides, for this purpose, a memory device comprising molecules capable of storing charges which are used for storing information. The expressions "charge storage molecules" and "molecules capable of storing charges" are used interchangeably in the present application. At least some of these molecules are and/or comprise at least one polyoxometallate (POM). The charge storage molecules have a multiplicity of oxidation states, enabling their advantageous use in multibit storage devices. The expression "multibit storage" denotes the storage of several bits in a memory cell.

The multiplicity of oxidation states of the charge storage molecules may especially be obtained by using several types of different POMs each having at least one oxidation state different from the oxidation state or states of the other POMs. The multiplicity of oxidation states may also be obtained by using POMs that are identical but have several different oxidation states.

Advantageously, the POMs of the memory device according to the invention comprise at least two oxidation states.

The charge storage devices according to the invention are advantageously capacitive memory type devices.

The expression "capacitive memory" means any structure capable of storing charges, whether or not it incorporates a capacitor as such. The invention applies particularly well to capacitive memory of flash type, which stores charges in a transistor, or of DRAM type which stores charges in a capacitor.

The expression "redox compound" denotes any compound or molecule comprising elements involved in redox reactions induced by the application of a suitable potential.

In the present application and in what follows, the term "polyoxometallates" denotes oxides of metal atoms having at least one oxidation state, preferably two different oxidation states. Typically, the metal atoms are transition or rare-ground metals which are generally in their highest degree of oxidation and which are found at the center of a distorted octahedron of oxygen atoms $O^{2-}$. Under the preferred conditions of use of the invention, isopolyanions, of general formula $[M_qO_y]^{n-}$ in which M represents a transition or rare-ground metal atom, q represents an integer varying from 11 to 21, y represents an integer from 39 to 62 and n represents an integer varying from 1 to 20, are used. Under other preferred conditions of the invention, heteropolyanions of general formula $[X_zM_qO_y]^{n-}$ that comprise at least one additional cation X are used, M representing a metal atom and z represents 1 or 2, q represents an integer varying from 11 to 21, y represents an integer from 39 to 62 and n represents an integer varying from 1 to 20.

More specifically, one subject of the present application is a memory device:
  comprising a capacitor combined with a field-effect transistor in which all or some of the molecules capable of storing the charges comprising at least one polyoxometallate are incorporated into the capacitor, for example of DRAM type; or
  using at least one field-effect transistor, in which the molecules capable of storing the charges comprising at least one polyoxometallate are incorporated into the floating gate of said transistor, for example of flash type.

A POM used for storing charges may especially be a heteropolyanion of which the structure is of the Keggin $(XM_{12}O_{40})^{n-}$ type or the Dawson $(X_2M_{18}O_{62})^{n-}$ type, n being an integer varying from 1 to 20. Preferably, the additional cation X is chosen from phosphorus, silicon, arsenic, germanium, sulfur and boron. The cation may especially play the part of assembling aggregates of metal atom oxides. Advantageously, the Keggin structures are chosen from $(PW_{12}O_{40})^{3-}$, $(SiW_{12}O_{40})^{4-}$, $(PMo_{12}O_{40})^{3-}$, whereas the Dawson structures will be chosen from $(P_2W_{18}O_{62})^{6-}$, $(Si_2W_{18}O_{62})^{6-}$, $(P_2Mo_{18}O_{62})^{6-}$.

The POM of the device according to the invention comprises at least one transition or rare-ground metal atom. Preferably, the transition metal or rare-ground atom is chosen from tungsten, molybdenum, vanadium, niobium or tantalum, lanthanum, actinium, ruthenium, iron, nickel and chromium. The POM according to the invention does not contain or is not generally combined with europium, such as in the form of a heteropoly-tungstate derivative of europium of formula $[Eu(H_2O)P_5W_{30}O_{110}]^{12-}$.

Advantageously, the POM according to the invention moreover comprises at least one additional cation different from the metal or rare-ground atoms. Preferably, the additional cation is chosen from phosphorus, silicon, arsenic, germanium, boron and sulfur.

According to one preferred embodiment, the charge storage molecules form a molecular architecture structured along a polymer chain, and/or by grafting along polymer chains and/or by dispersion and/or grafting in a polymer network. Such an organization is particularly advantageous as it allows optimum dispersion of the molecules capable of storing charges on a surface. In order to enable such an architecture in a polymer chain, the charge storage molecules may comprise functional groups which allow a polymerization, preferably a radical or ionic polymerization. Advantageously, the functional groups allowing a chain polymerization of the molecules capable of storing charges are of acrylic, ethylenic or vinyl type such as the $CH_2=C(Me)C(O)OPr$ functional group (C. Mayer and R. Thouvenot, *Chem. Mat.*, 2000, 12, 257). More preferably, at least one POM of a charge storage molecule comprises at least one polymerization functional group. For example, one preferred POM of the invention corresponding to the formula $[La(IIII)(\alpha\text{-}SiW_{11}O_{39}(H_2O)^{3-}]^{5-}$ arranges itself in the form of mineral polymer chains, allowing a one-dimensional arrangement of monovacant structures of Keggin $(\alpha\text{-}SiW_{11}O_{39})^{8-}$ type.

According to another preferred embodiment, one POM comprises at least one vacancy capable of being combined with another element. Thus, the term "vacancy" denotes an insertion site. The term "other element" denotes a metal or rare-ground atom of the charge storage molecule incorporating the POM or another charge storage molecule. Advantageously, the metal atom may especially be chosen from lanthanum and actinium.

By modifying the nature of the transition metals, it is possible to modulate their redox properties. Depending on their oxidation state, they can donate or accept several electrons without modification of the initial structure.

The POMs are particularly thermally stable and have different oxidation states which allow advantageous use in memory devices, especially including field-effect transistors such as in flash memories or capacitors combined with field-effect transistors such as in DRAM-type memory.

According to one preferred embodiment, the charge storage molecules according to the invention are incorporated into a capacitor combined with a field-effect transistor. Preferably, the capacitor incorporating the charge storage molecules is provided in a DRAM-type memory.

According to another preferred embodiment, the charge storage molecules according to the invention are incorporated into a component of a field-effect transistor. Generally, a field-effect transistor of the device according to the invention comprises:

a substrate comprising a channel;

a source and a drain positioned on opposite sides of the channel and in electrical contact with the latter; and a control gate positioned on top of the channel and at least separated from the latter by a control dielectric and a floating gate, the floating gate comprising at least some of said molecules capable of storing charges.

Preferably, the control dielectric of the transistor of the device according to the invention comprises at least one mineral insulating layer or an electrolytic gel. The ions of the electrolytic gel provide a control dielectric function. The properties of the material and the thickness of the electrolytic gel may be optimized for voltages which determine electron transfer and/or charge storage. Generally, the electrolytic gel is prepared by dissolving an electrolyte chosen from tetrabutylammonium hexafluorophosphate (TBAH), $LiPF_6$, $LiClO_4$ and $LiBF_4$ in a solvent chosen from propylene carbonate, sulfolane, 3-methyl-2-oxazolidinone, 4-methyl-2-pentanone. The viscosity of the gel may be controlled by addition of a high molecular weight polymer material chosen from polyvinylidene fluoride/hexafluoropropylene, 2-hydroxyethyl methacrylate, acrylonitrile, methyl methacrylate, polyethylene oxide or polyphosphazenes. According to an alternative embodiment, the solvent/electrolyte medium may be replaced by an ionic liquid whose viscosity is controlled by a polymer material such as described above. The ionic liquids which are generally used within the context of the invention are 1-ethyl-3-methylimidazolium tetrafluoroborate, 1-ethyl-3-methyl-imidazolium trifluoromethanesulfonate, 1-(1-butyl)-3-methylimidazolium hexafluorophosphate or 1-butylpyridinium tetrafluoroborate.

According to another preferred embodiment, the molecules capable of storing charges are positioned directly, and/or via bonds, on a surface of the device according to the invention. Preferably, a POM of a charge storage molecule comprises at least one bond.

The expression "a surface of the device" denotes a channel or tunnel dielectric or capacitor surface. The bond comprises a spacer and at least one binding group capable of binding it to a surface of the device. The spacer may be aliphatic, especially linear, branched or cyclic and may comprise one or more heteroatoms. Advantageously, the heteroatom is chosen from an atom of nitrogen, of oxygen, of sulfur, of phosphorus, of silicon or a halogen.

The expression "binding group" denotes any group or function capable of generating one or more bonds of covalent or non-covalent type with at least one molecule of the surface of the device.

Preferably, the bond comprises an alkyl and/or an aryl. When the bond comprises a $C_1$ to $C_{20}$ alkyl, this alkyl is preferably a $C_1$ to $C_{15}$, advantageously $C_1$ to $C_{12}$, especially $C_1$ to $C_{10}$, particularly $C_1$ to $C_8$, most particularly $C_1$ to $C_5$ linear or branched alkyl, chosen from: hydroxyalkyl, mercaptoalkyl, selenylalkyl, tellurylalkyl, cyanoalkyl, isocyanoalkyl, carboxyalkyl, aminoalkyl, dihydroxyphosphorylalkyl, trichlorosilylalkyl, trimethoxysilylalkyl, dithioalkyl, dithiocarboxyalkyl, alkyldiazonium.

When the bond comprises a $C_1$ to $C_{20}$ aryl, this aryl is preferably a $C_1$ to $C_{15}$, advantageously $C_1$ to $C_{12}$, especially $C_1$ to $C_{10}$, particularly $C_1$ to $C_8$, most particularly $C_1$ to $C_5$ linear or branched aryl, chosen from: hydroxyaryl, mercaptoaryl, selenylaryl, tellurylaryl, cyanoaryl, isocyanoaryl, carboxyaryl, aminoaryl, dihydroxyphosphorylaryl, trichlorosilylaryl, trimethoxysilylaryl, dithioaryl, dithiocarboxyaryl, aryldiazonium.

Advantageously, the field-effect transistor of the device according to the invention moreover comprises a tunnel dielectric positioned between the floating gate and the channel, said tunnel dielectric comprising at least one layer of dielectric material. The expression "dielectric material" is understood to mean at least any one of the materials chosen from a semiconductor oxide, a semiconductor nitride, a rare-ground oxide, a metal oxide, an electrolytic gel, an electrolytic polymer, bonds for charge storage molecules.

Advantageously, each charge storage molecule of the device according to the invention comprises at least one functional group enabling the polymerization and/or at least one bond enabling the attachment of said molecule to a surface of said device.

The surface on which the charge storage molecules are positioned preferably comprises a metal such as platinum, mercury, gold, indium tin oxide (ITO) or carbon and its various forms such as graphite, highly oriented pyrolytic graphite (HOPG), carbon nanotubes, diamond, or electronically conductive or semiconductive polymers, or mineral semiconductors or a mixture of the latter. The electronically conductive or semiconductive polymers are linear and/or cyclic polyenes chosen from polypyrrole, polyaniline, polythiophene and derivatives thereof, said polyenes optionally being substituted by heteroatoms. The mineral semiconductors are preferably chosen from silicon, germanium, carbon or alloys of the latter, or III-V semiconductor compounds such as GaAs, InP, InSb or alloys of the latter and/or metal oxides, or II-VI semiconductor compounds such as CdTe, or alloys of the latter and/or metal oxides.

According to one preferred embodiment, the charge storage molecules are dispersed in an electrolytic layer. The electrolytic layer may be composed solely of an electrolyte gel. It may moreover comprise polyelectrolytes (cationic and/or anionic polyelectrolytes) and/or ionomers (cationic and/or anionic ionomers). Advantageously, the electrolytic layer comprises the bonds which enable the molecules according to the invention to bond to the surface of the device, said molecules being dispersed in an electrolyte gel.

According to another preferred embodiment, the molecules capable of storing the charges are arranged in separate regions. Preferably, said molecules are separated by a deposition thus creating discrete trapping sites. Thus, if a defect appears, it will only affect the charge located on top of the defect (FIG. 3). Such a structure therefore decreases the leakage currents (SILC effect). Advantageously, it is then possible to decrease the thickness of the dielectric while retaining good retention and endurance properties.

Advantageously, the deposition or the control dielectric of the device according to the invention comprises a cationic electrolytic polymer preferably chosen from polyethyleneimine, polyallylamine, various quaternized forms of polyvinylpyridine, soluble and cationic precursors of polyparaphenylenevinylene and derivatives thereof substituted on the ring or the ethylenic bond.

Advantageously, the deposition or the control dielectric comprises at least one layer of, preferably cationic, surfactant, more preferably dimethyldioctadecylammonium (DODA) bromide.

Preferably, the deposition or the control dielectric comprises a layer comprising at least one electrolyte polymer and at least one surfactant, at least one electrolyte gel, at least one semiconductor oxide (such as $SiO_2$), at least one semiconductor nitride (such as $Si_3N_4$), at least one rare-ground oxide (such as $HfO_2$) or at least one metal oxide.

In the device according to the invention, the charge storage properties of the charge storage molecules are dependent on the POMs and not on the surface on which they are immobilized. The charge is stored in the oxidation states of the POMs, which allows a high charge density. The charge retention times are also a property of the POMs and consequently are not dependent on the characteristic leakages of conventional information storage devices (of capacitor-transistor type). The POMs may be immobilized easily on a very high density surface by simple and inexpensive processes such as described hereinbelow, thus making it possible to minimize the surface. Temperatures as high as 400° C. may be used during the manufacture or use of the device according to the invention without the POMs degrading since they have a transient thermal stability reaching 500° C. and a stationary thermal stability reaching 350° C. in an air/water medium; this thermal stability property is all the more important as numerous steps for fabricating the devices are carried out at high temperatures. Thus, the Dawson POM $\alpha\text{-}[W_{18}O_{56}(SO_3)(H_2O)_2]^{8-}$ only loses 0.9 wt % at 400° C. by internal redox rearrangement and loss of two water molecules (Long et al., *Angew. Chem. Int.*, 2005, 44, 3415-3419). The memory devices may be miniaturized insofar as the electronic properties are intrinsic to the structures of the POMs. Finally, multiple bits may be stored in one memory cell using several different oxidation states of each POM. This is because multibit storage exploits the presence of multiple oxidation states of the POMs.

Another subject of the present invention is a process for producing a memory device according to the invention, according to which POMs are deposited on a surface of said device, preferably using a process chosen from adsorption, immersion followed by withdrawal at a controlled rate, electrodeposition, grafting, electrolysis, layer-by-layer deposition, adsorption, immersion followed by withdrawal at a controlled rate, and deposition on the rotating surface.

Advantageously, the surface on which the charge storage molecules are deposited is treated prior to the deposition of said molecules using, for example and preferably, a process for preparing said surface chosen from pickling, surface activation, irradiation, heating, sensitization of the surface, oxidation of the surface, reduction of the surface, hydration, deposition of binder compound intended to be eliminated, at least partly, during the deposition of the charge storage molecules.

Among the surfaces which may be used, it will be possible to include any surface having pendent —OH, —NH$_2$, —COOH groups or their chemical, photochemical, thermal or electrochemical precursors. Advantageously, the surface is first pickled or oxidized when the latter comprises silicon.

The charge storage molecules according to the invention may advantageously be dissolved in aqueous solvents, such as $H_2SO_4$, especially aqueous $H_2SO_4$, or in organic solvents such as an alcohol, acetonitrile, dimethylformamide (DMF). The charge storage molecules according to the invention may also be dispersed within a binder compound which may especially be a polymer such as polyvinyl alcohol, or a gel of butyl alcohol/vinyl alcohol or of cellulose, (Kuhr et al., *MRS Bulletin*, 2004, 11, 838-842) or a hybrid gel by reaction over 3-glycidoxypropyltrimethoxysilane (Judeinstein et al., *Adv., Mat. for Optics & Electronics*, 1997, 7, 123-133). The molecules according to the invention may also be arranged as a network in polymer chains. These depositions may optionally be followed by annealing at a temperature that eliminates the binder compound and leaves the molecules according to the invention in a three-dimensional homogeneous deposition, the distribution of which is controlled.

For a deposition by adsorption, the surface concentration depends on the relative position of the reduction potentials of the molecules according to the invention and the oxidation potentials of the metal (Kuhn et al., *J. Electroanal. Chem.*, 1999, 462, 187-194). The adsorption is a universal surface phenomenon based on the fact that any surface composed of atoms that do not have all their chemical bonds fulfilled therefore have a tendency to make up for this lack by capturing atoms and compounds that pass in proximity. Differention is made between physisorption, where the identity of the adsorbed compounds is retained and chemisorption which leads to the rupture of chemical bonds. Physisorption corresponds to a preferred embodiment. The energy involved during a chemisorption process, which leads to covalent grafting, is greater than that involved during a physisorption process.

According to the invention, the deposition of the charge storage molecules may also be carried out by electrodeposition. According to one particular embodiment, a first step comprises the spontaneous adsorption by immersion such as described previously, followed by a second step of electrochemical activation by reduction. Although the aggregation mechanism is little understood, such an electrodeposition process has the advantage of allowing a strong attachment by electroplating.

One variant of producing the electrodeposition uses electropolymerization combined with doping of the electronically conductive and/or semiconductive polymers, preferably chosen from polypyrrole, polyaniline, polythiophene and derivatives thereof. Thus, the electropolymerization of polypyrrole in the presence of Keggin POM advantageously allows the deposition of POM-doped polypyrrole (G. Bidan et al., *J. Electroanal. Chem.*, 1988, 251, 297-306) The thickness of the deposition corresponding to the amount of charge storage molecules deposited on the surface is directly controlled by the number of coulombs of the electrosynthesis.

According to another embodiment, the charge storage molecules may be deposited by inclusion in Langmuir-Blodgett films (E. Coronado and C. Mingotaud, *Adv. Mat.*). This technique exploits the adsorption properties of POMs on monolayers that are positively charged and that are first deposited on the channel. Advantageously, this layer may be an amino alkyl or an SAM, especially obtained from 3-aminopropyltrimethoxysilane.

According to another embodiment, the deposition of the charge storage molecules may be carried out by the LbL (layer-by-layer) technique in order to obtain POM multilayers superposed on a suitable surface. The LbL technique conventionally results in the manufacture of composite deposits composed of alternating layers of oppositely charged polymers (G. Decher, *Science*, 277, 1232-1237 (1997)). Insofar as the POMs are sufficiently bulky and are charged species, the LbL technique may be applied to them. Preferably, the charge storage molecules are combined with cationic polymers according to a technique comparable to that used in electrochromism (S. Liu et al., *J. Amer. Chem. Soc.*, 2002, 124, 12279-12287; D, Ingersoll et al., *J. Amer. Chem. Soc.*, 1994, 141, 140; L, Cheng and S. Dong, *Electrochem. Commun.*, 1999, 1, 159). Among the cationic polyelectrolyte polymers that can be used, mention is made, nonlimitingly, of polyethyleneimine, polyallylamine and various quaternized forms of polyvinylpyridine. Preferably, the first layer of the LbL assembly may be composed of POMs adsorbed or grafted onto a surface that has been previously modified, especially by imine groups. It is possible to couple the technique of LbL by immersion with the electrochemical activation (potentiostatic or potentiodynamic method) in order to obtain reproducible successive depositions of POM. Advantageously, the LbL deposition makes it possible to disperse the PONs in multilayers in order to obtain a three-dimensional POM network. The LbL deposition also makes it possible to combine PONs of different natures, especially having different oxidation states, in order to optimize the storage of charges especially in a multibit storage device. The LbL deposition finally makes it possible to adapt the concentration and the distribution of POMs of different nature within one multilayer system. Such a multilayer system may be considered as a novel design of floating gate capacitive memory.

According to another embodiment, the deposition of the molecules according to the invention may be carried out by covalent grafting to a surface using the binder group. Advantageously, —O⁻ or, —OH surface groups on POMs make it possible to apply numerous condensation reactions of organic compounds comprising R—NH$_2$, R—OH and R—COOH groups (or their activated, ester, etc. form), thus resulting in POM=N—R, POM-O—R or POM=OOC—R. The R group may be an organic constituent preassembled on a surface (*Angew. Chem., Int. Ed.*, 2005, 44, 1254-1257) or that enables grafting or self-assembly. Advantageously, the covalent grafting of the charge storage molecules according to the invention onto a surface is possible due to the presence of vacancies in Keggin or Dawson POMs. This is because the vacancy may, in particular, serve as an anchoring point for compounds capable of reacting over the vacant oxygen atoms, especially including silanes (C. Mayer et al., *Chem. Mat.*, 2000, 12, 257-260) or stannanes (S. Bareyt et al., *J. Amer. Chem. Soc.*, 2005, 127, 6788-6794).

Henceforth, memory devices comprising charge storage molecules are provided which are not only stable at high temperatures, but which are also fabricated according to processes commonly used in the field.

Furthermore, it is possible to use these molecules as a mixture for multibit storage devices without distribution problems appearing. The Applicant has specifically discovered, with astonishment, that molecules of which at least some are and/or comprise at least one polyoxometallate (POM) made it possible to manufacture heat-stable charge storage memory devices. Furthermore, due to the thermal stability and the multiplicity of oxidation states of the POMs, the design of multibit storage devices is possible.

Thus, the Applicant has discovered that the redox properties and the thermal stability of the POMs made it possible to substitute them or to incorporate them, in addition to dielectric materials, in charge storage memory devices, including, in particular, in dielectrics provided for flash memory or DRAM memory.

Another subject of the invention is the use of a polyoxometallate to produce, in a memory device, variations in the amounts of charge that are sufficiently large to obtain an electric memory effect that can be used in DRAM and flash memory applications.

A final subject of the invention is any electronic instrument containing memory devices such as defined above and especially a computer, a games console, a telephone, an electronic organizer, a video or music player, or an electric household appliance.

BRIEF DESCRIPTION OF THE DRAWINGS AND DETAILED DISCLOSURE

The invention will be better understood when reference is made to the appended figures.

FIG. 1 represents a field-effect transistor of a flash memory cell comprising a source (7), a drain (6), a channel (5) and a substrate (8). The two dielectrics of the memory play an additional role. The tunnel dielectric (4), located between the channel of the transistor and the floating gate is generally a thermal silicon oxide (SiO$_2$) with a thickness of around 7 to 9.5 nm for the 90 nm flash F technology node (source: International Technology Roadmap for Semiconductor, 2004 [http://www.itrs.net/Common/2004 Update/2004 Update-.htm]). It is through this oxide that the charges are injected toward the floating gate. The control dielectric (2) located between the floating gate (3) and the control gate (1) has a double role. It must capacitively couple the control gate and the floating gate in order that during the application of a programming voltage to the control gate, a maximum voltage is found between the floating gate and the channel. It must also have very low leakage currents in order not to deteriorate the operation of the memory. This control dielectric is generally either a silicon oxide of HTO (High Thermal Oxide) type, or composed of three oxide (SiO$_2$)-nitride (Si$_3$N$_4$)-oxide (SiO$_2$) layers that is also referred to as "ONO" layers. $V_S$, $V_D$, $V_{CG}$ respectively represent the voltages applied to the source, the drain and the control gate.

FIG. 2 represents a characteristic graph of the drain current $I_D$ as a function of the control gate voltage $V_{CG}$ of the memory in the "written" and "erased" states. $V_{th}$ corresponds to the threshold voltage.

FIG. 3 demonstrates the advantages which are liked to the incorporation of discrete trapping sites within a transistor floating gate (3). In a memory with a continuous floating gate (3) a defect in the tunnel oxide (4) causes the loss of all the charge stored (FIG. 3a). In a memory with a floating gate (3) having discrete trapping sites, only the storage site located on top of the defect loses its charge (FIG. 3b).

FIG. 4 schematically represents a Dawson POM of formula $(X_2Me_{18}O_{62})^{6-}$ with X=Si or P and Me=W, Mo, Va, the vacancy compound presented is $\alpha_2$-$[P_2W_{17}O_{61}]^{10-}$, (A) and a vacancy Keggin POM of formula $(SiW_{12}O_{40})^{4-}$ (B).

FIG. 5 corresponds to a polyhedral representation (A) and a bond representation (B) of the structure of the phosphomolybdate Keggin ion $(PMo_{12}O_{40})^{3-}$.

Figure 9:
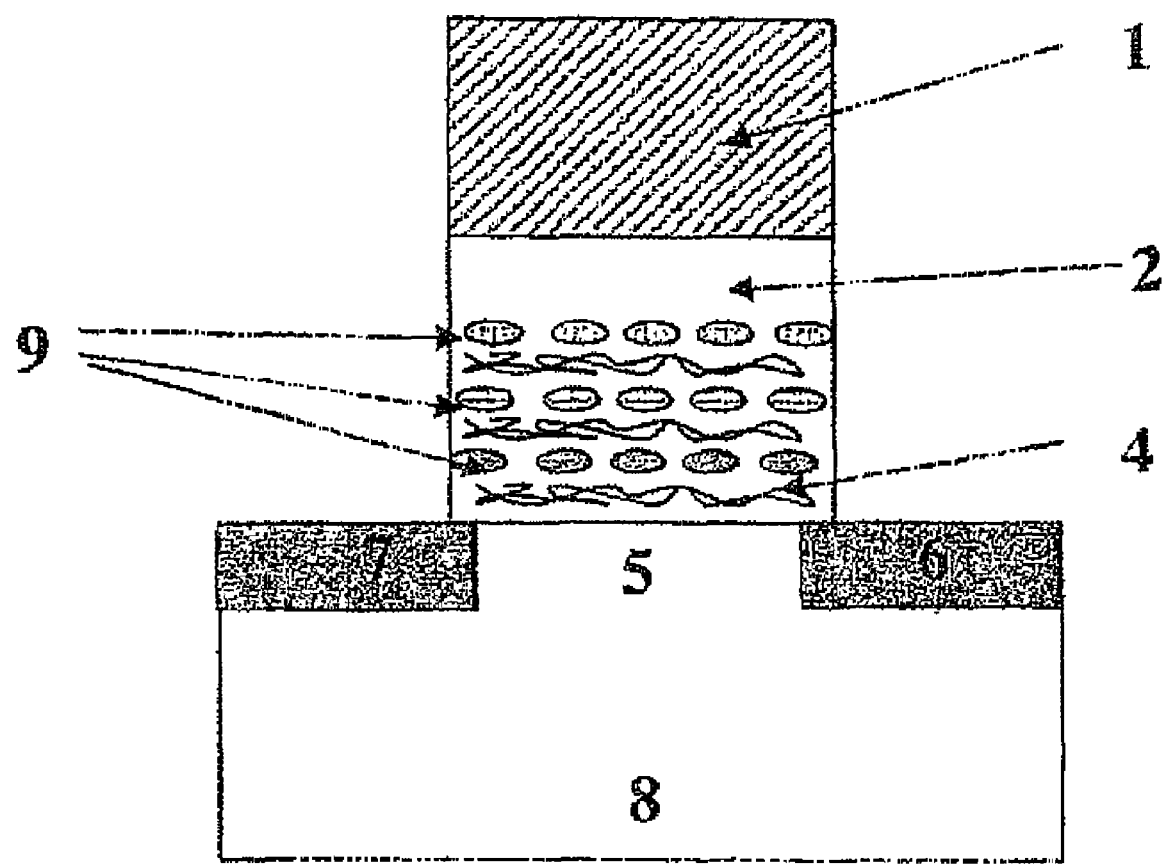

FIG. 9 represents a structure of a field-effect transistor in which the charge storage molecules according to the invention are positioned as superposed multilayers on a surface of the channel. Two layers of molecules (9) according to the invention are separated by an electrolytic layer (electrolytic gel, electrolyte polymer, ionomers, etc.). The electrolytic layer positioned on the surface of the channel may act as a tunnel dielectric.

Figure 10:
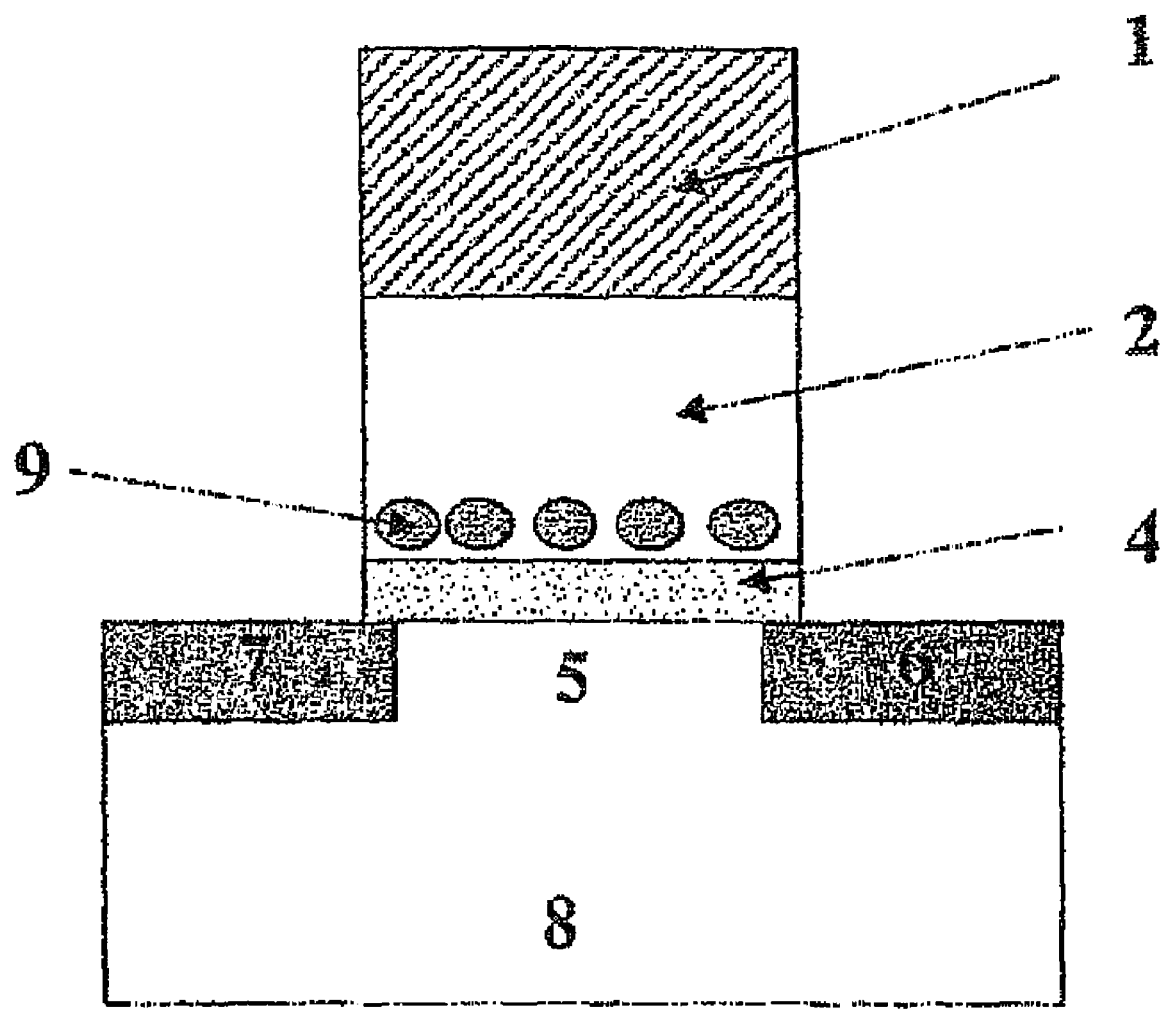

FIG. 10 represents a structure of a field-effect transistor in which the charge storage molecules (9) according to the invention are positioned on the surface of a tunnel dielectric (4) that comprises at least one layer of dielectric material and/or an electrolytic layer. The control dielectric (2) may comprise an electrolytic gel.

Figure 11:
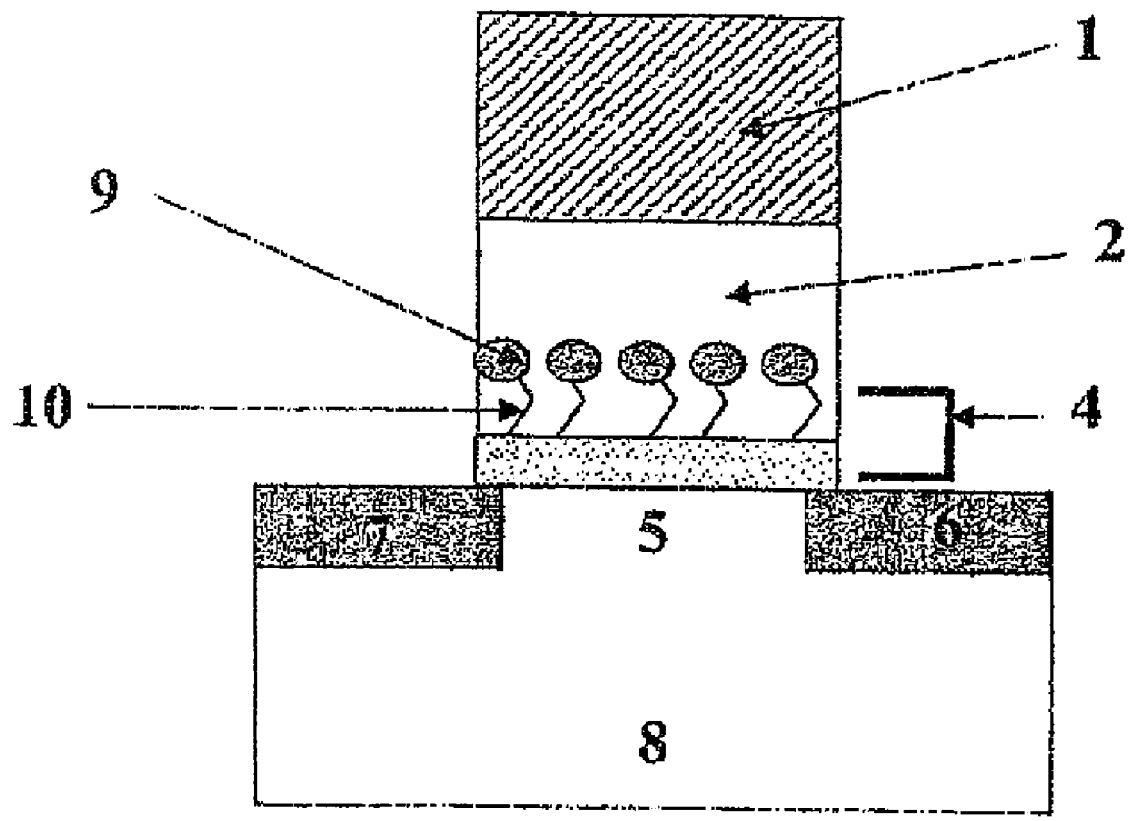

FIG. 11 represents a structure of a field-effect transistor in which the charge storage molecules (9) according to the invention are assembled via bonds (10) on a surface comprising at least one layer of dielectric material and/or an electrolytic layer, the assembly forming a tunnel dielectric (4).

Figure 12:
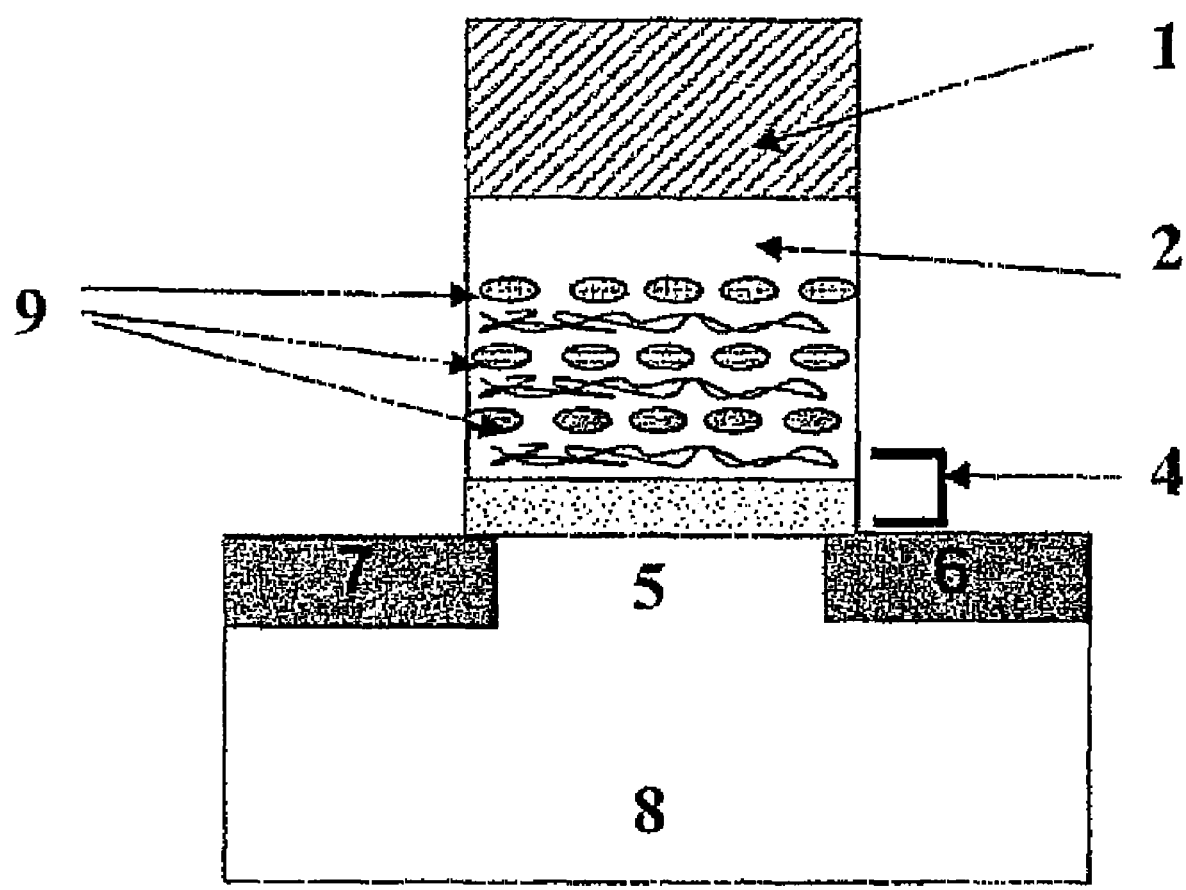
Figure 13:
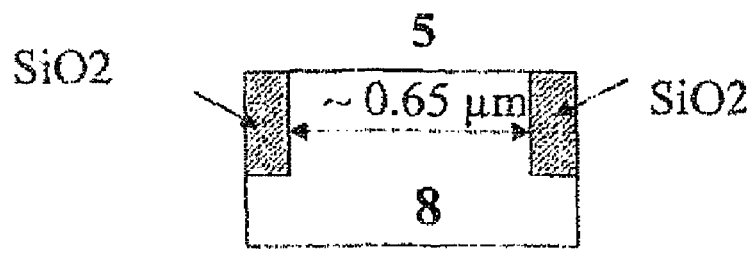
Figure 13:
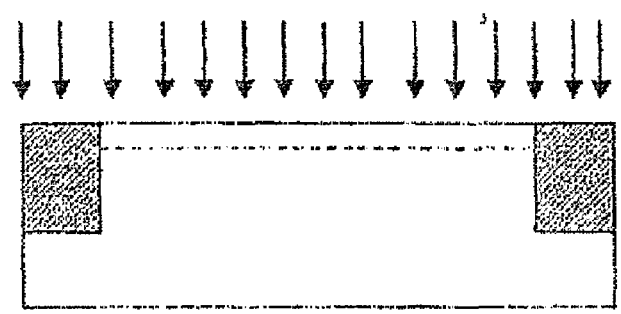
Figure 13:
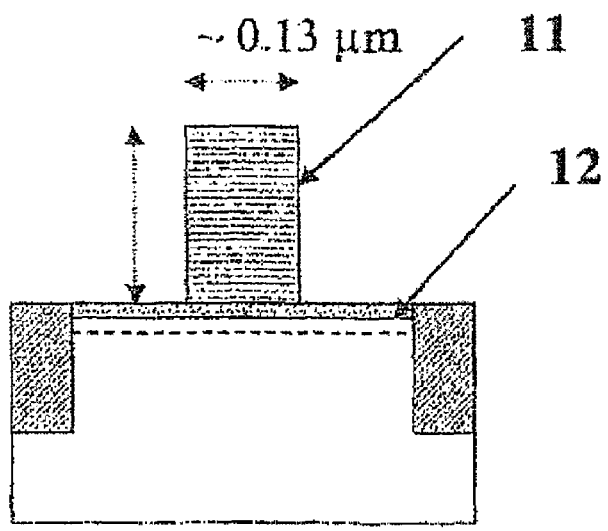

FIG. 12 represents a structure of a field-effect transistor in which the charge storage molecules (9) according to the invention are positioned as superposed multilayers on a surface of the tunnel dielectric (4) that comprises at least one layer of dielectric material and/or an electrolytic layer. Two layers of molecules (9) according to the invention are separated by an electrolytic layer (electrolytic gel, electrolyte polymer, ionomers, etc.).

FIGS. 13 to 17 illustrate a process for fabricating a transistor with a 130 nm sacrificial damascene gate MOS (metal oxide semiconductor) technology, During the first step, lateral isolation zones of thick $SiO_2$ oxide (a few hundreds of nm to a few μm of thickness) (FIG. 13a) are created in the silicon substrate (p-doped for an nMOS transistor and n-doped for a pMOS transistor) (8) around active zones (AZ), in which the devices will be produced. These isolation zones are fabricated by using conventional techniques such as STI (shallow trench isolation) ox LOCOS (LOCalized Oxidation of Silicon) isolation. The channel fabricating step consists in adjusting the surface doping of the silicon of the active zones by obviously taking into account the initial doping of the Si substrate to adjust the threshold voltage $V_{th}$ of the transistor. This is achieved with conventional ion implantation techniques (FIG. 13b). Next, a sacrificial dielectric (12), of a few nm in thickness, is conventionally formed by a thermal oxidation process. The sacrificial gate (11) made of polycrystalline silicon and having a thickness of around a few tens of nanometers to a few hundreds of nanometers, is fabricated by the conventional techniques of deposition, photolithography and etching (FIG. 13c). The step of fabricating the source and drain regions (FIG. 14) comprises:

LDD (Lightly Doped Drain) ion implantation of the order of $10^{13}$ atoms/cm$^2$, in order to reduce the resistance of the source and drain to the channel (FIG. 14a);

formation of the spacer (13) made of a dielectric material (for example $SiO_2$ or $Si_3N_4$) by deposition of the dielectric and anisotropic plasma etching with stopping on the etching over the silicon (FIG. 14b);

HDD (Highly Doped Drain) ion implantation at a high dose of around $10^{15}$ atoms/cm$^2$ (FIG. 14c); and activation annealing of the dopants, for example by means, of a rapid thermal annealing (RTA) between 900 and 1050° C. for a duration of a few tens of seconds.

Figure 14:
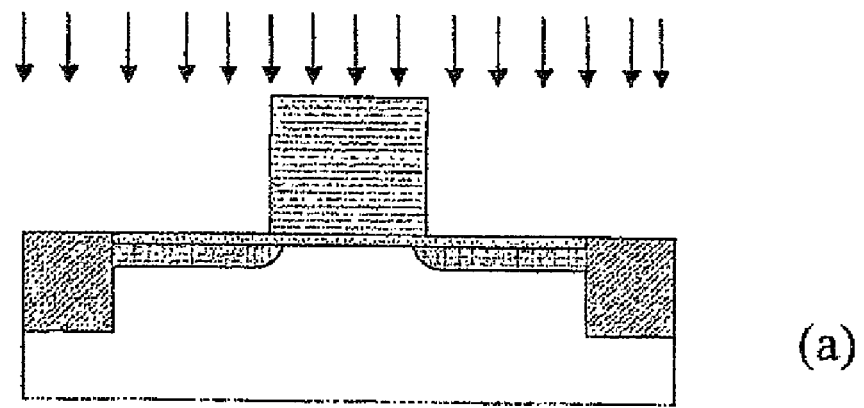
Figure 14:
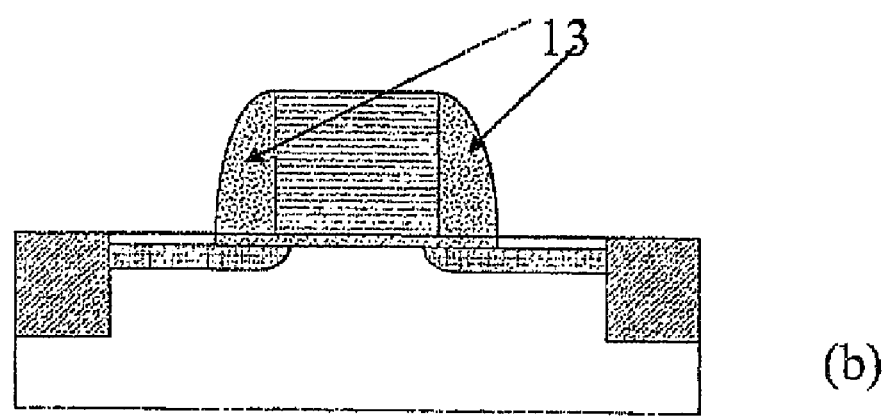
Figure 14:
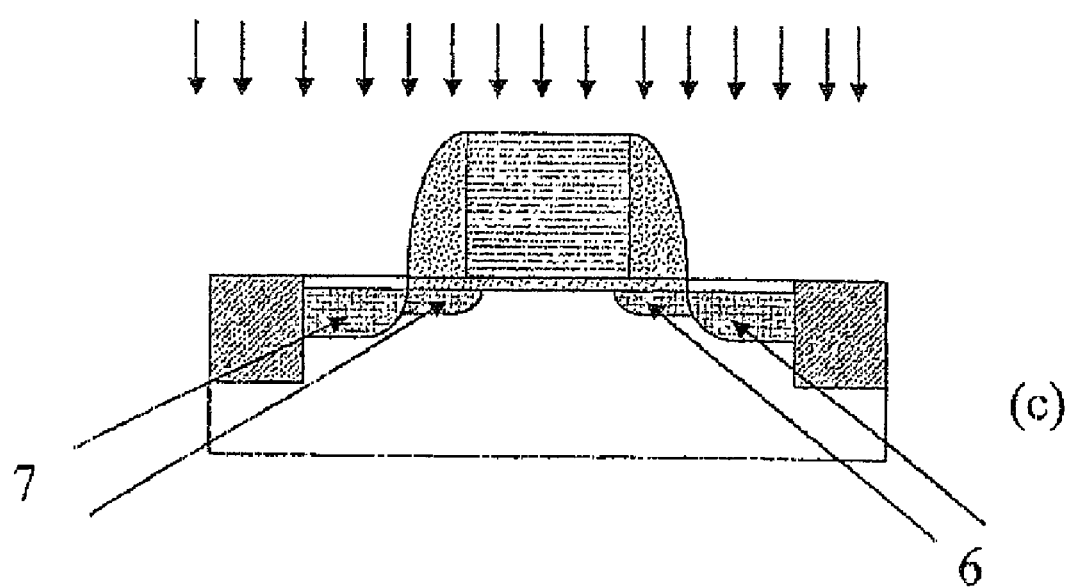
Figure 15:
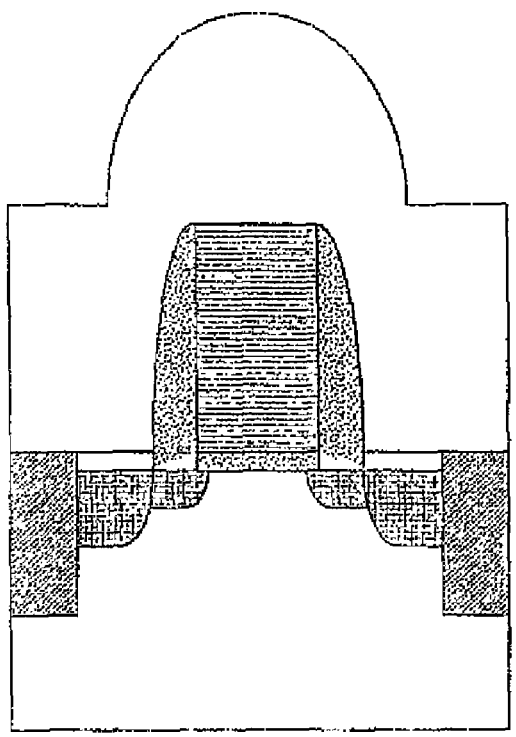
Figure 15:
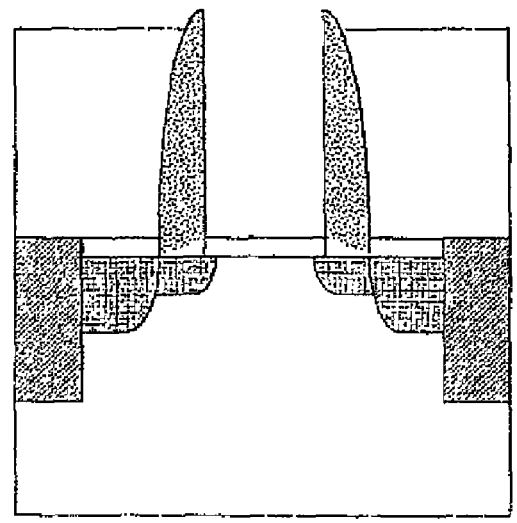
Figure 16:
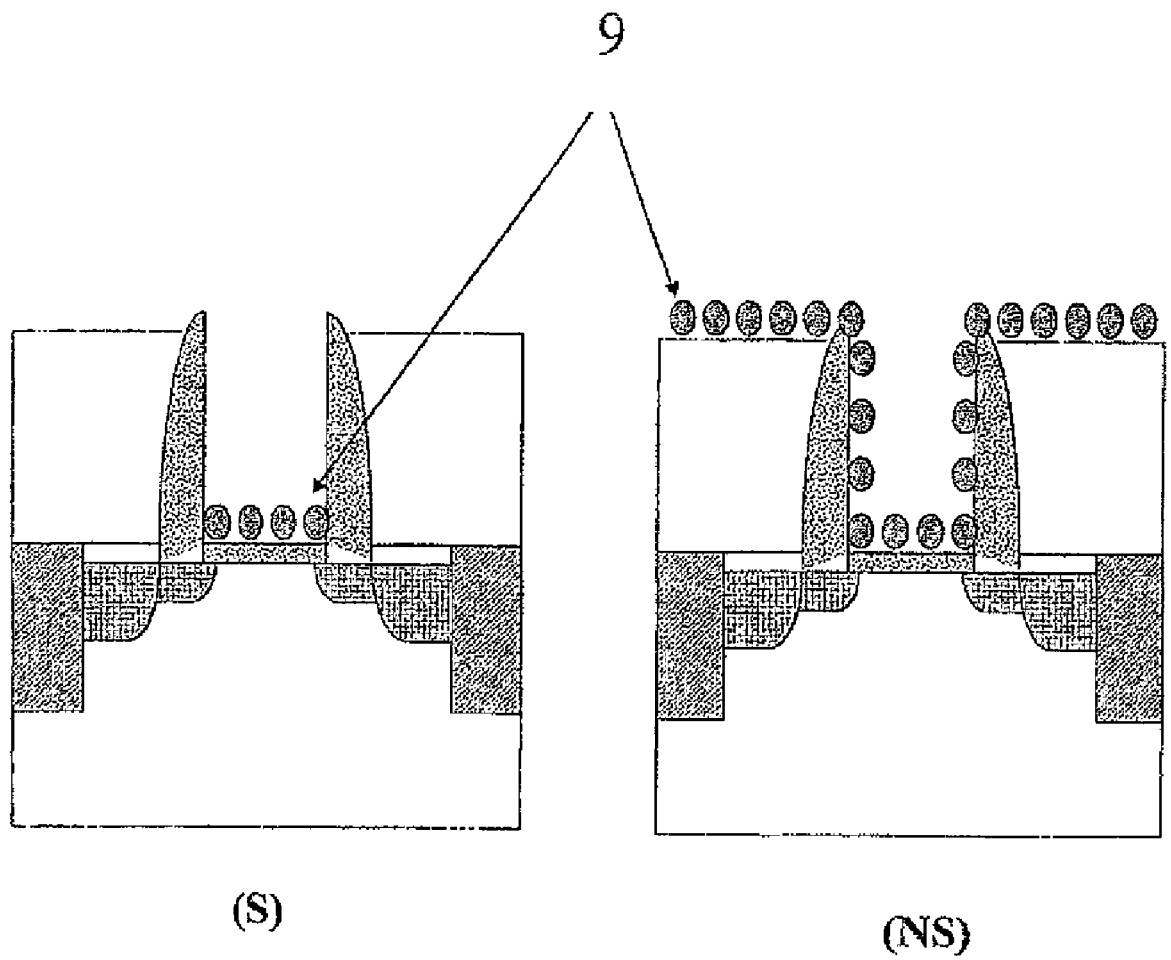

The sacrificial gate is then subjected to an etching step illustrated by FIG. 14 and that involves the steps of:

encapsulation by a thick dielectric with a material such as $SiO_2$ (FIG. 15a);

chemical-mechanical polishing to expose the top of the sacrificial poly Si gate;

etching the poly Si gate selectively relative to the dielectrics; and etching of the sacrificial dielectric at the base of the gate (FIG. 15b).

Figure 17:
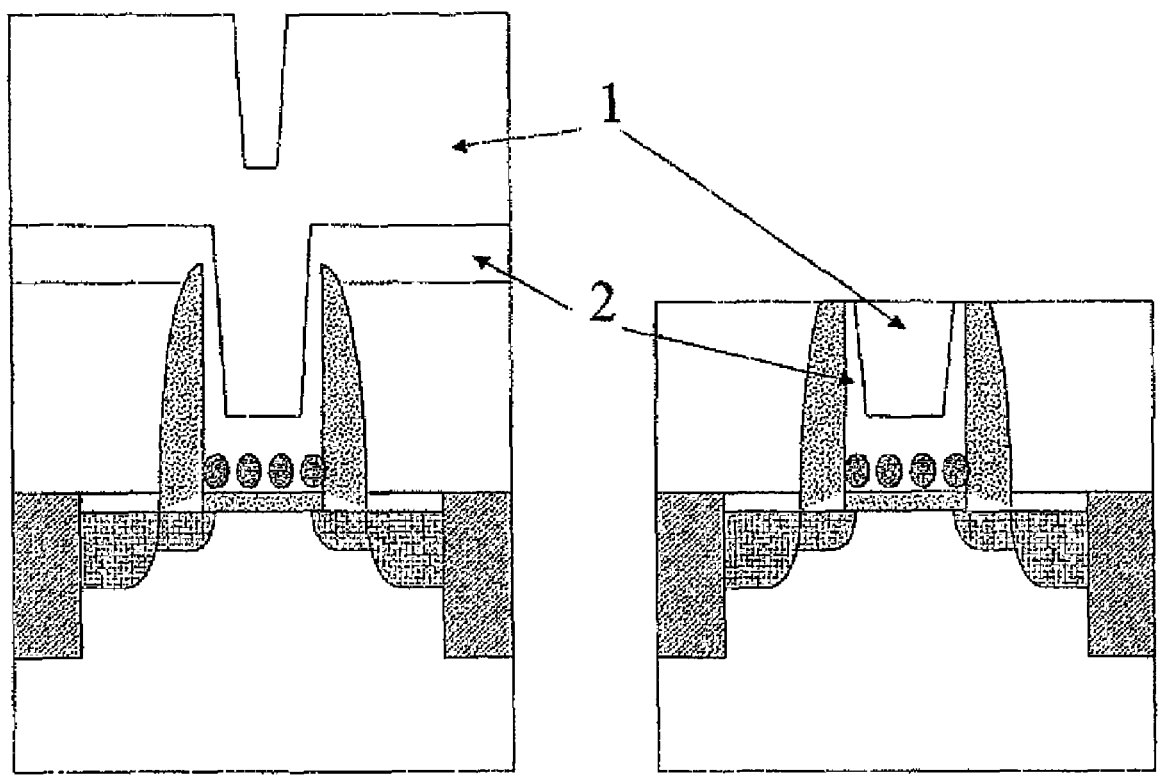

The tunnel dielectric (a few nanometers in thickness) is conventionally produced according to a thermal oxidation process illustrated by FIG. 17. The molecules (9) according to the invention are then grafted or deposited selectively (S) or non-selectively (NS) at the base of the sacrificial gate (FIG. 16) The step of fabricating the control dielectric and the control gate (polycrystalline Si or metal for the control gate) is carried out by deposition followed by chemical-mechanical planarization of the multilayer of the various layer-s in order to open the control gate on the gate stack (FIG. 17). Finally, the last steps for producing contacts and metallizations are conventional (pre-metal dielectric deposition, contacts, metallization, passivation).

Figure 1:
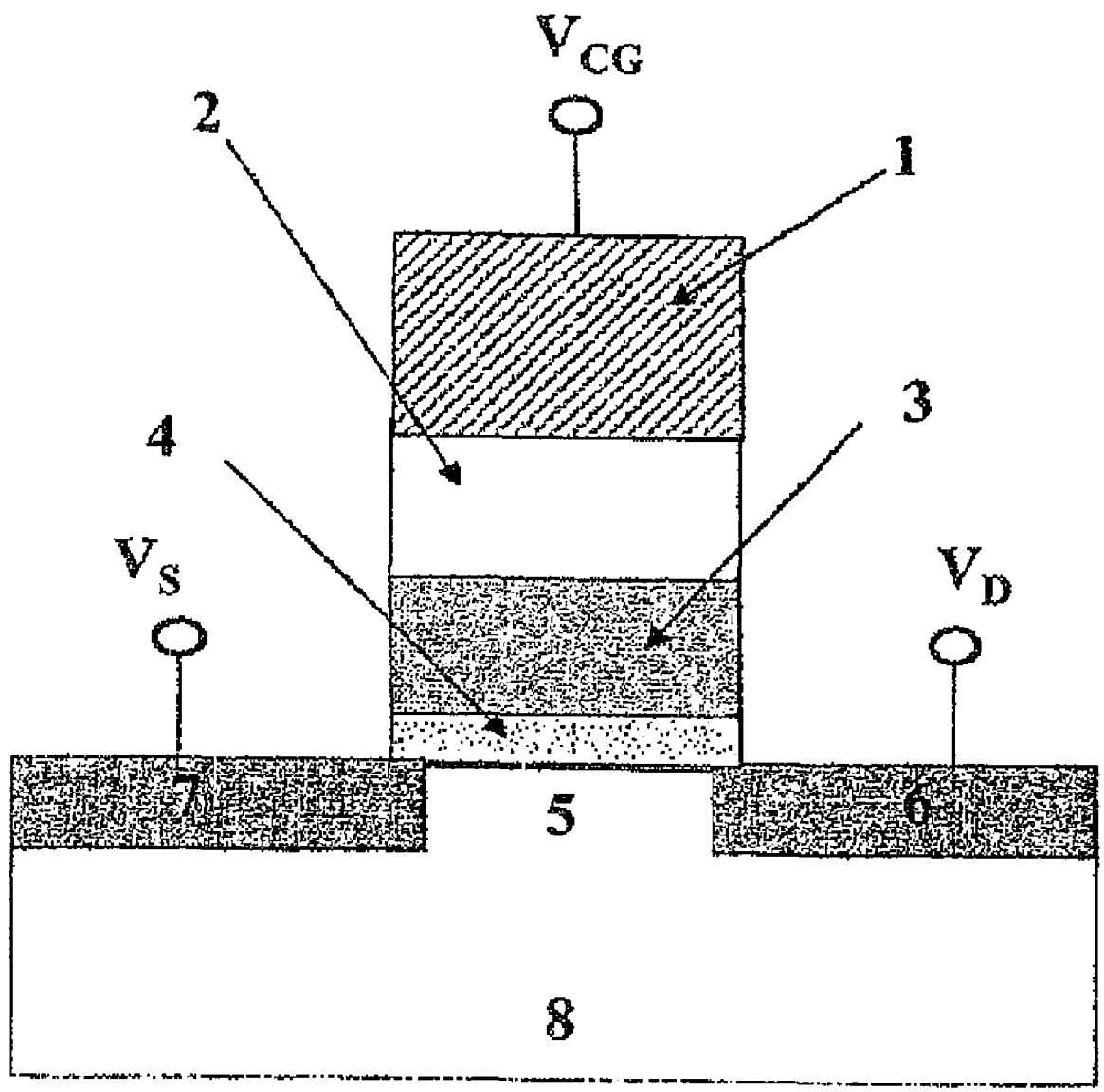
Figure 2:
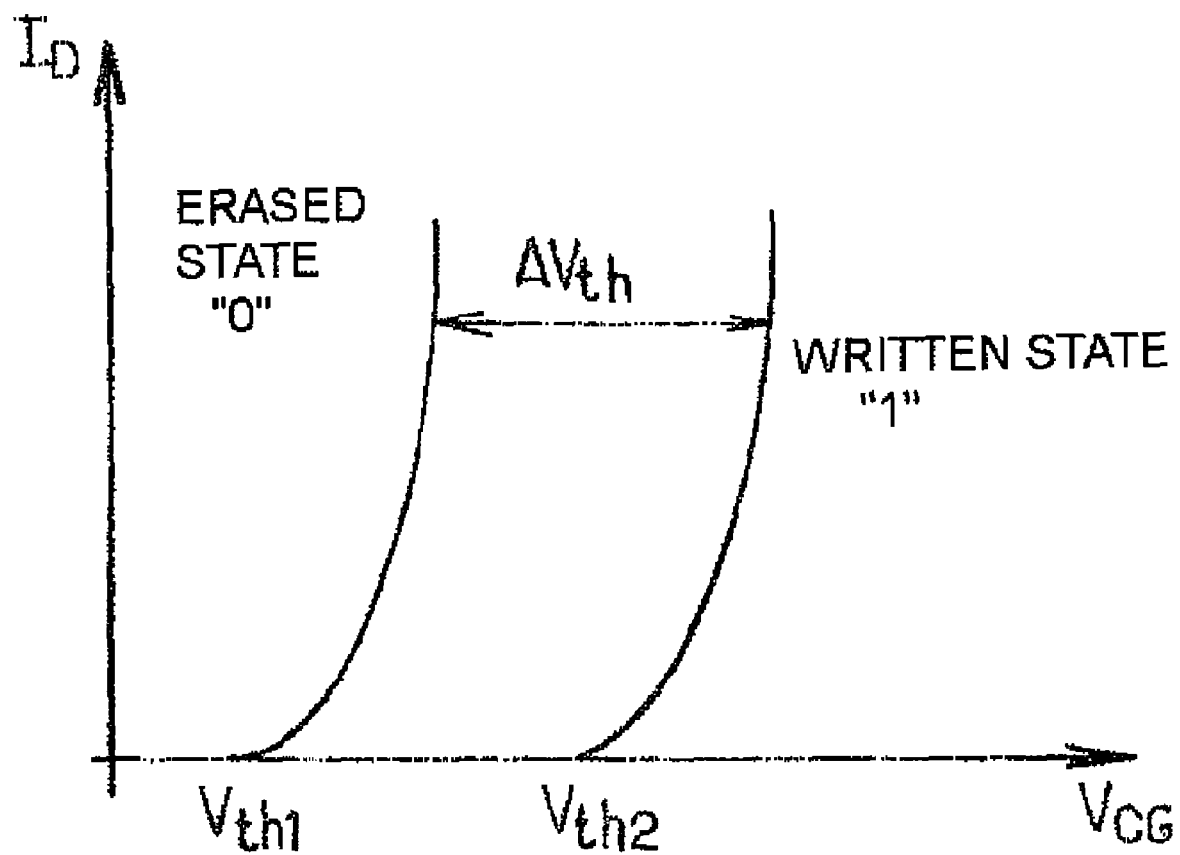
Figure 3:
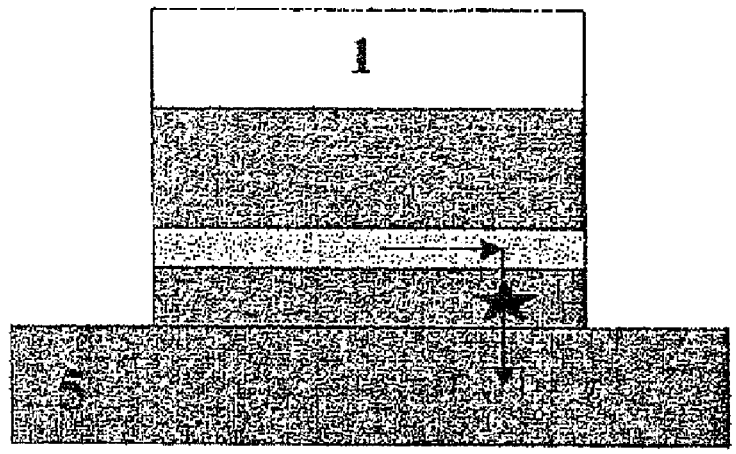
Figure 3:
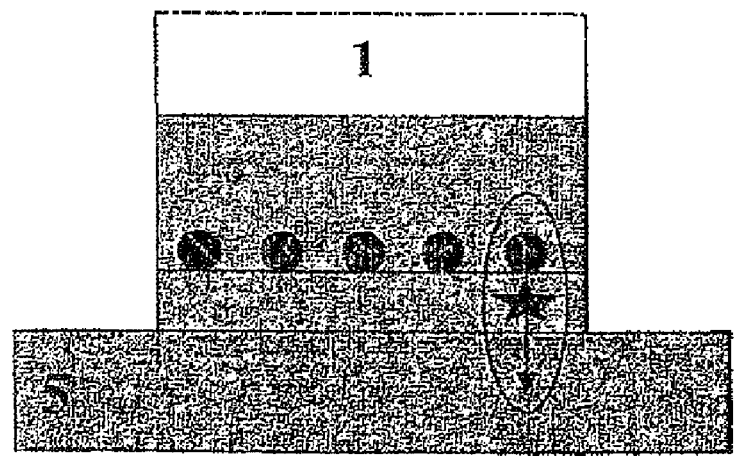
Figure 4:
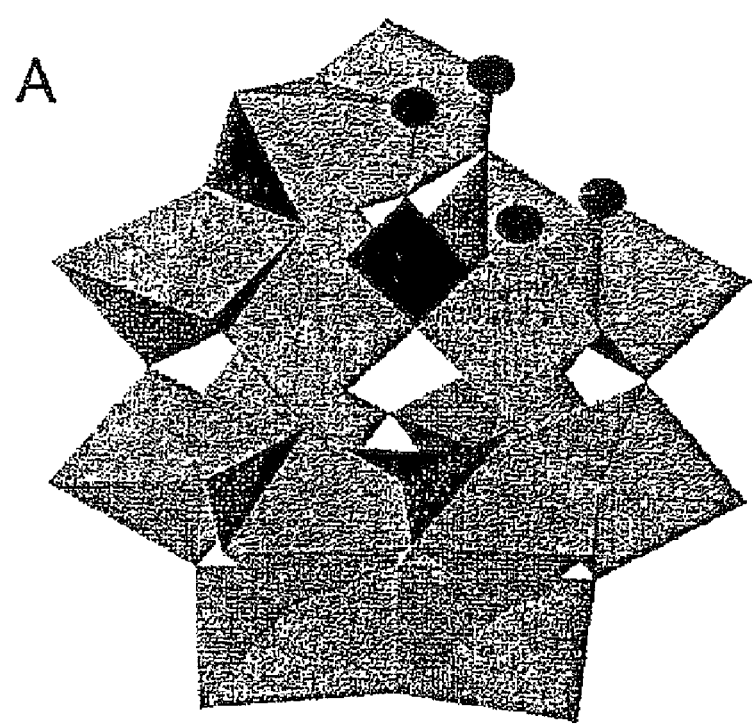
Figure 4:
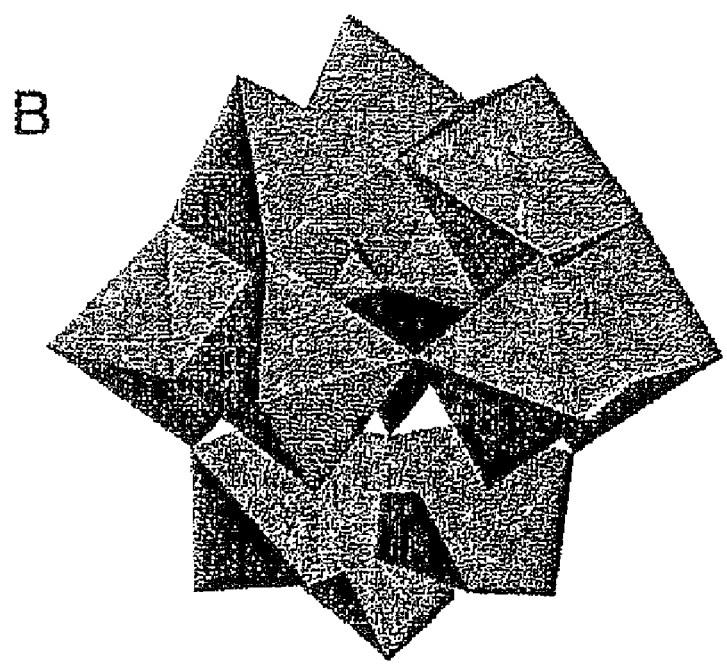
Figure 5:
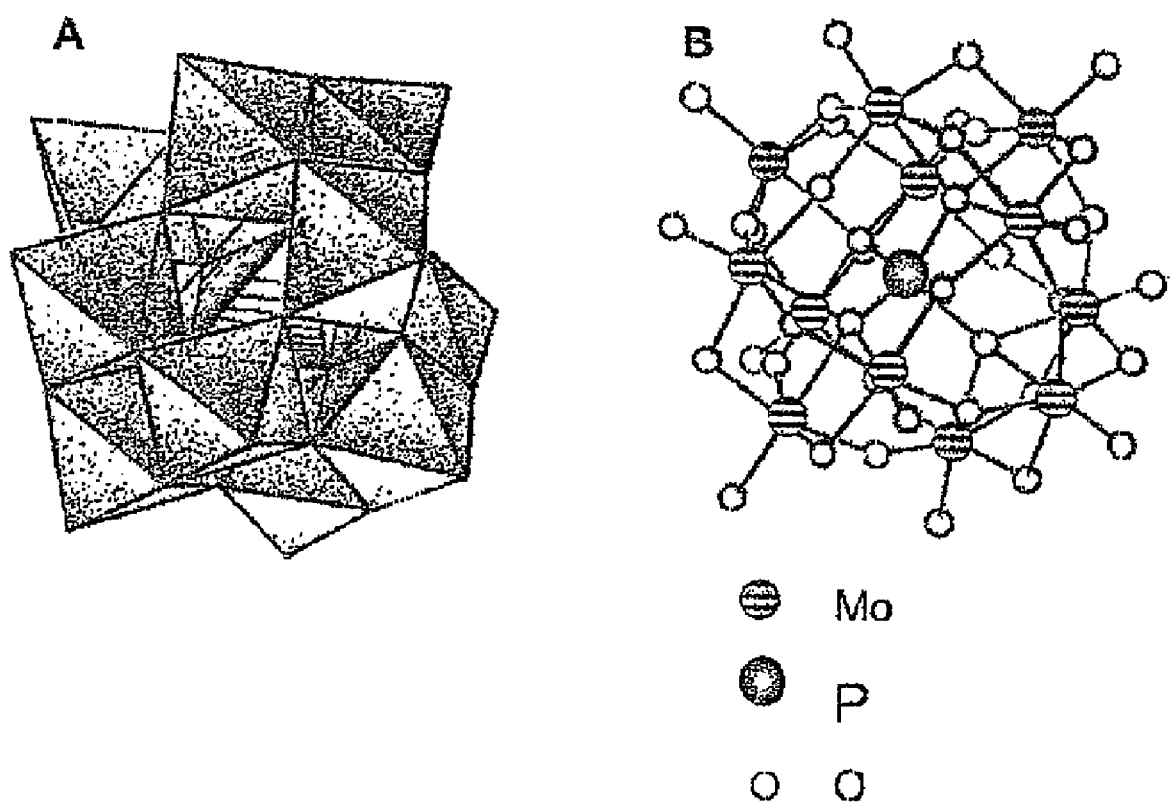
Figure 6:
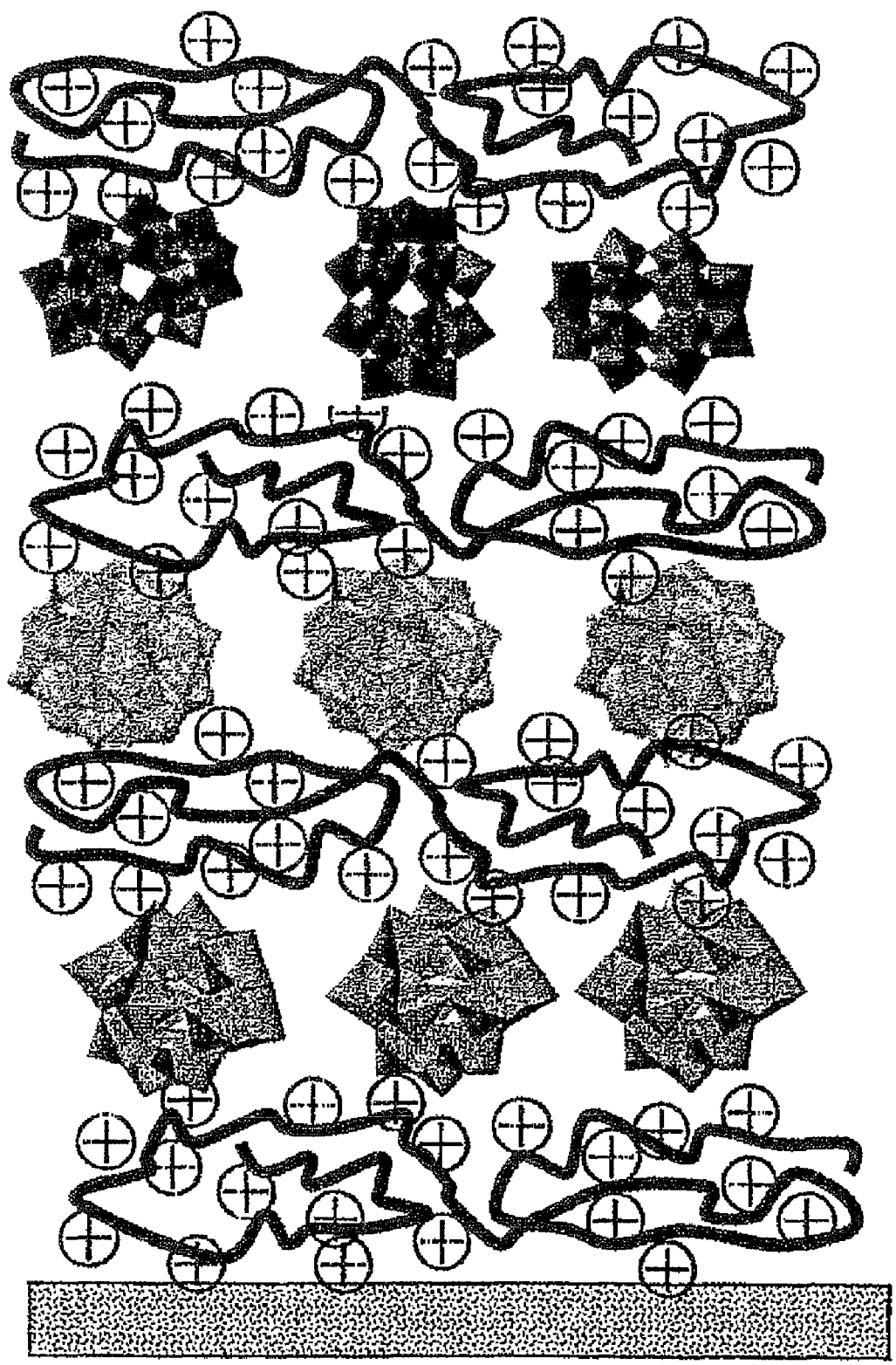
FIG. 6 represents a multilayer system of POMs of different nature deposited on a suitable surface. A layer of cationic electrolytic polymers (symbol (+)) separates two POM layers (stack of aggregates).
Figure 7:
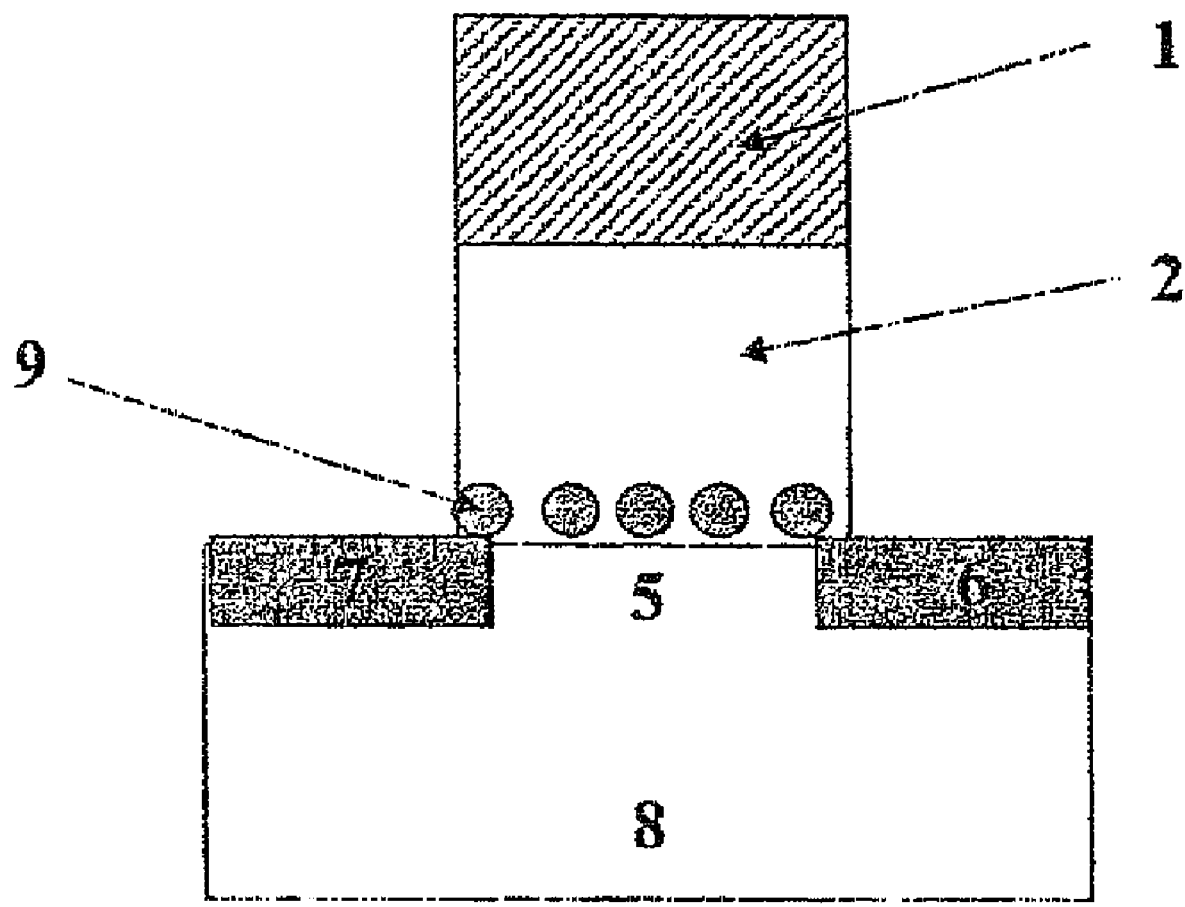
FIG. 7 represents a structure of a field-effect transistor in which the charge storage molecules (9) according to the invention are positioned on the surface of the channel (5) of a substrate (8), the channel being located between the drain (6) and the source (7). The control dielectric (2) may comprise an electrolyte gel.
Figure 8:
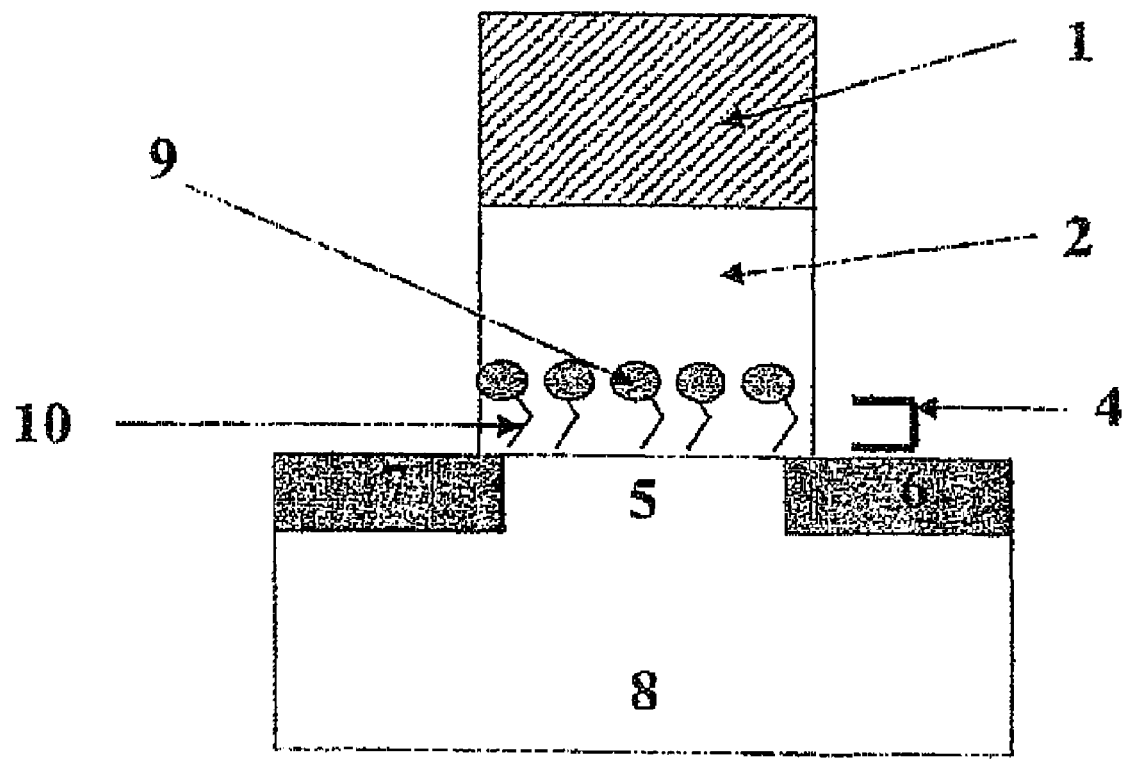
FIG. 8 represents a structure of a field-effect transistor in which the charge storage molecules (9) according to the invention are assembled on a surface of the channel (5) via bonds (10). According to one embodiment variant, the bonds are dispersed in an electrolyte gel (4) and thus can act as a tunnel dielectric.
Figure 18:
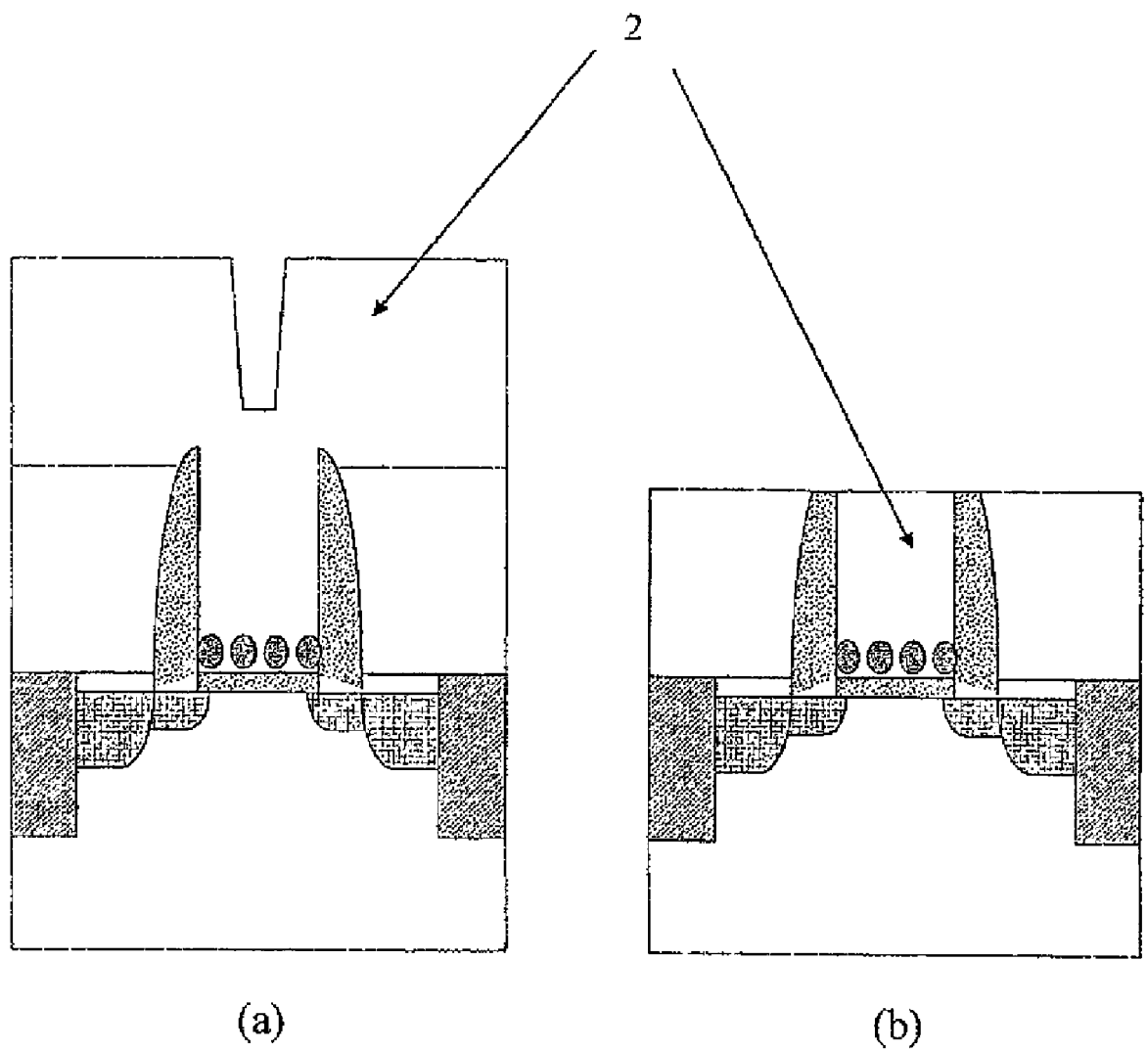
Figure 19:
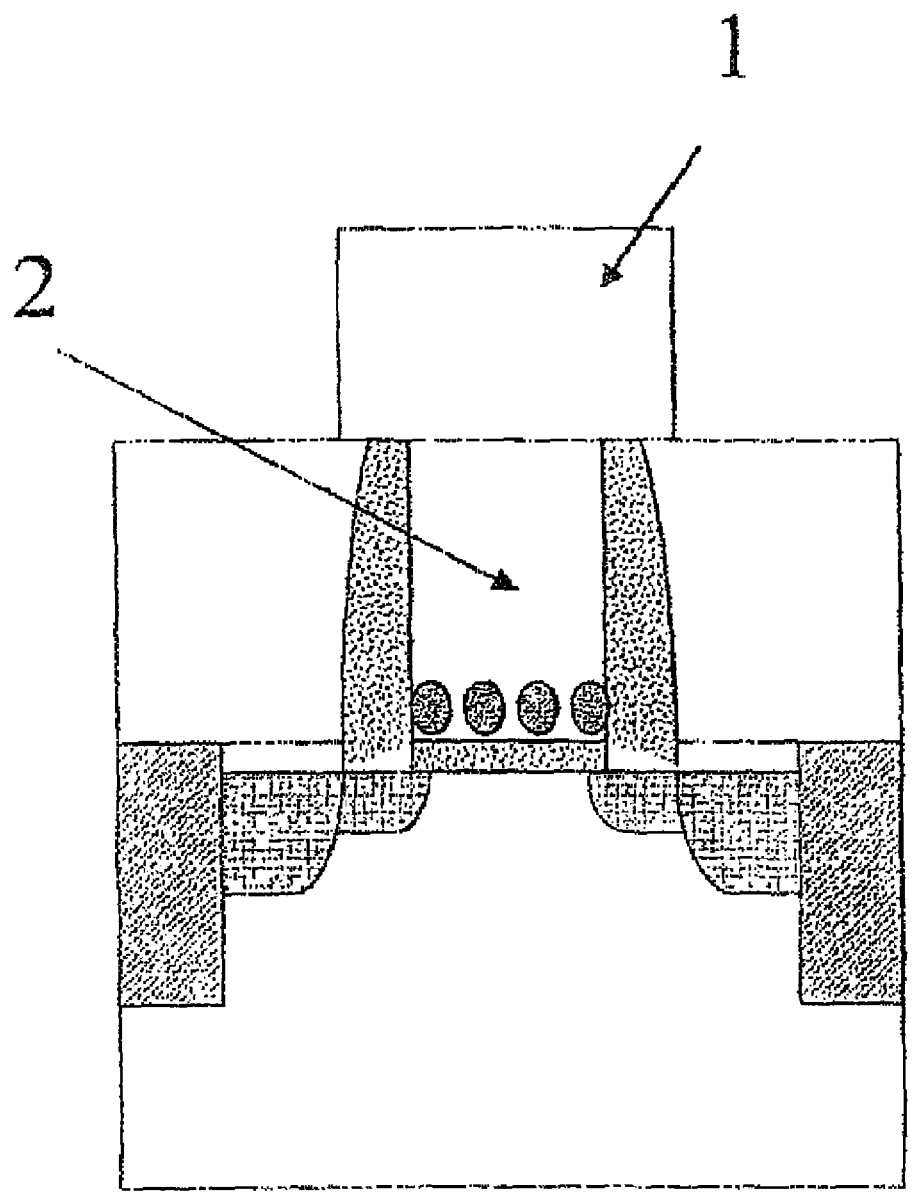

FIGS. 18 and 19 illustrate an embodiment variant according to which the control dielectric comprises an electrolyte gel. The production steps are the following:

deposition of the electrolyte gel (2) (FIG. 18a);

chemical-mechanical planarization of the surface combined or not with an etching process in order to retain the electrolyte gel only at the position of the sacrificial gate (FIG. 1b); and production of the control gate (1) made of polycrystalline silicon or of metal by the conventional techniques of deposition, photolithography and etching (FIG. 19).

As in the previous embodiment (FIGS. 13 to 17), the last steps for producing contacts and metallizations are conventional (pie-metal dielectric deposition, contacts, metallization, passivation).

The present invention will be better understood with the aid of the following examples; these examples are given solely by way of illustrating the subjects of the invention, of which they in no way constitute a limitation.

EXAMPLE 1

Multiplicity of the Redox States of the POMs

The Keggin POMs of formula $(PW_{12}O_4O)^{3-}$, $(SiW_{12}O_{40})^{4-}$, $(PMo_{12}O_{40})^{3-}$ each have 5 oxidation states which correspond to the successive reductions of the $W^{VI}$ or $Mo^{VI}$ atoms to their V degrees. If one restricts oneself to the first 3 bioelectronic systems, the first reduction appears respectively at −0.37, −0.3 and +0.42 V, the second at −0.51, −0.49 and +0.28 V and the third at −0.79, −0.74 and +0.04 V (vs Ag/Ag$^+$). For each POM, the potentials are separated by around 140 mV, which is particularly advantageous in terms of multibit storage.

The negative differential resistance (NDR) obtained by near-field microscopy of the Keggin POM layers on graphite has been correlated to the reduction potentials of the POMs. The overlapping substitutions of the cation, the heteroatom and the vacancy polyatom make it possible to modulate the NDR over more than one volt. $H_3PW_{12}O_{40}$, NDR=−1.14V, $H_5PMo_{10}V_2O_{40}$, NDR=−0.48V.

Also, Dawson vacancy POMs substituted by $Fe^{III}$, $Co^{II}$, $Mn^{II}$, $Cu^{II}$ make it possible to enrich the electro-activity of the POM by that of the substituting transition metal (T, McCormac et al., *J. Electroanal, Chem.*, 1997, 425, 49-54).

EXAMPLE 2

Thermal Stability of the POMs

The thermal stability varies as a function of the structure and of the nature of the associated counter-ions. For example, the compound $H_3PMo_{12}O_{40}$ decomposes at 443° C. and its potassium salt at 493° C. The diallyl-ammonium salts of POM, especially including $PMo_{12}O_{40}^{3-}$, are capable of withstanding temperatures above 300° C. in an ambient atmosphere (R. Baur et al., *Chem. Abstr.*, 1993, 120: 334828). Also, the POx corresponding to the formula $H_3PMo_{12}O_{40}$ is capable of withstanding temperatures ranging from −50 to 500° C. (H. Schmidtpott et al., *Chem., Abstr,* 1987, 106: 55168).

EXAMPLE 3

POM Gel

One charge storage molecule according to the invention is $\alpha_2$-$[P_2W_{17}O_{61}\{(RSi)_2O\}]^{6-}$ with $\alpha_2$-$[P_2W_{17}O_{61}]^{6-}$ denoting a Dawson vacancy POM and R being a group comprising a function that enables the polymerization of vinyl type R=$CH_2$=C(Me)C(O)OPr described by C. Mayer and R. Thouvenot (*Chem. Mat.*, 2000, 12: 257).

According to another process described by S. Bareyt, et al., (*JACS*, 2005, 127: 6788), one molecule according to the invention is $\alpha_2$-$[P_2W_{17}O_{61}\{SnCH_2CH=CH_2\}]^{7-}$.

EXAMPLE 4

Charge Storage Molecule Comprising a Bond for Forming Self-Assembled Monolayers

According to a process similar to the preceding one, the molecule is $\alpha_2$-$[P_2W_{17}O_{61}\{Sn(CH_2)_2CO_2\}]^{7-}$, the carboxylic groups enable the attachment onto any surface comprising groups capable of coupling with them such as hydroxyls.

EXAMPLE 5

Preparation of a Phosphomolybdate Monolayer 5.1. Step of Adsorption by Immersion A POM of formula $K_4SiW_{12}O_{40}$ is dissolved to 0.07 M in a 0.5 M aqueous solution of $H_2SO_4$. A silicon surface, previously electrochemically pickled, is immersed in the $K_4SiW_{12}O_{40}$ solution for 15 minutes then dried. The surface concentration of POM is $10^{-10}$ mol/cm$^2$.

5.2. Step of Electrochemical Activation

This first step of adsorption is followed by a step of activation by reduction to −1.2 V which produces films of "heteropolyanion blues" formed by the complex arrangement of colloidal species comprising the elements present in the initial POMs determined by electron microprobe analysis (Castaing technique) (B. Keita et al., *J. Electroanal. Chem.*, 1988, 247, 157).

EXAMPLE 6

Formation of an SAM in Two Steps

According to a process described by R. Errington et al., (*Chem. Int. Ed.*, 2005, 44: 1254), the silicon surface alone or covered by a layer of tunnel dielectric may be previously covered by a hydroxy-undecyl layer which then reacts by alcoholysis on a POM of structure $[(RO)TiW_5O_{18}]^{3-}$ to give an SAM of $\{>\!\!-\!(CH_2)_{12}\!-\!O\!-\![TiW_5O_{18}]^-\}_n$ type where >- symbolizes the bond to the support.

Such a process may be extended to the formation of SAMs comprising more bulky POMs of Keggin $[(RO)TiPW_{11}O_{39}]^{4-}$ or Dawson $[(R_2Si_2O)PW_{17}O_{61}]^{6-}$ type.

EXAMPLE 7

Deposition of POM in Multilayers

Quartz, silicon or glass surfaces covered with ITO are cleaned according to the procedures known to a person skilled in the art (Kern W. *RCA Eng.* 1983, 28, 99; Phillips B. *Vac. Sci. Technol. A* 1983, A1, 646; Kern, W. *Semicond. Int.* 1984, 94). The surfaces are immersed in a solution of polyethyleneimine polymer (PEI, molecular weight 50 kDa) having a concentration of $10^{-2}$ mol/l for 20 minutes, rinsed with water, then dried under a stream of argon. The Keggin phosphomolybdate aggregates/electrolytic polymers multilayer system is prepared by first depositing the polystyrene sulfonate (PSS, MW 70 kDa) and polyallylamine hydro-chloride) (PAH, MW 8-11 kDa) polymers on the PEI-modified surface. These layers of electrolytic polymers are deposited by adsorption of aqueous solutions with a concentration of $10^{-3}$ mol/l (pH 5-6), using an immersion time of 10 minutes. After the immersions, the surfaces are rinsed with water, then dried after deposition of the second layers of electrolytic polymers. The Keggin phosphomolybdate aggregates in aqueous solution (concentration of $5\times10^{-4}$ mol/l, pH 5-6) are adsorbed on the surface, the immersion time being 10 minutes. The ionic strength of the solutions is adjusted by NaCl.

The invention claimed is:

1. A charge storage memory device comprising:
   A flash type memory device using at least one field-effect transistor;
   A floating gate of said transistor having molecules capable of storing charges comprising at least of one polyoxometallate molecule,
   wherein the polyoxometallate comprises:
   at least one transition metal or rare-ground atom,
   at least one vacancy capable of combining with another element,
   at least one additional cation different from said metal or rare ground atoms, and
   wherein the charge storage molecules form a molecular architecture structured along a polymer chain.

2. The memory device as claimed in claim 1, wherein the charge storage device is of capacitive memory type.

3. The memory device as claimed in claim 1 wherein:
   comprising a capacitor combined with a field-effect transistor in which all or some of the molecules capable of storing the charges comprising at least one polyoxometallate are incorporated into the capacitor, for example of DRAM type; or
   using at least one field-effect transistor, in which the molecules capable of storing the charges comprising at least one polyoxometallate are incorporated into a component such as the floating gate of said transistor, for example of flash type.

4. The memory device as claimed in claim 1, wherein the polyoxometallate comprises at least two oxidation states.

5. The device as claimed in claim 1, wherein the transition metal or rare-ground atom is chosen from tungsten, molybdenum, vanadium, niobium or tantalum, lanthanum, actinium, ruthenium, iron, nickel and chromium.

6. The device as claimed in claim 1, wherein the additional cation is chosen from phosphorus, silicon, arsenic, germanium, boron and sulfur.

7. The device as claimed in claim 1, wherein said other element is a metal or rare ground atom of another charge storage molecule.

8. The memory device as claimed in claim 1 of DRAM type comprising a capacitor combined with a field-effect transistor, in which all or some of the molecules capable of storing the charges comprising at least one polyoxometallate are incorporated into the capacitor.

9. The memory device as claimed in claim 1, wherein the field-effect transistor comprises:
a substrate comprising a channel;
a source and a drain positioned on opposite sides of the channel and in electrical contact with the latter; and
a control gate positioned on top of the channel and at least separated from the latter by a control dielectric and a floating gate,
and in that the floating gate comprises at least some of said molecules capable of storing charges.

10. The memory device as claimed in claim 1 wherein the control dielectric comprises at least one mineral isolating layer or an electrolyte gel.

11. The memory device as claimed in claim 1, wherein the field-effect transistor moreover comprises a tunnel dielectric positioned between the floating gate and the channel, said tunnel dielectric comprising at least one layer of dielectric material.

12. The memory device as claimed in claim 8, wherein the molecules capable of storing charges are positioned directly, and/or via bonds, on a surface, said surface being a channel or tunnel dielectric or capacitor surface.

13. The memory device as claimed in claim 12, wherein the bond comprises a spacer and at least one binding group.

14. The memory device as claimed in claim 12, wherein the surface on which the charge storage molecules are positioned comprises a metal such as platinum, mercury, gold, indium tin oxide or carbon and its various forms such as graphite, highly oriented pyrolytic graphite, carbon nanotubes, diamond, or electronically conductive or semiconductive polymers, or mineral semiconductors or a mixture of the latter.

15. The memory device as claimed in claim 14, wherein the electronically conductive or semiconductive polymers are linear and/or cyclic polyenes chosen from polypyrrole, polyaniline, polythiophene and derivatives thereof, said polyenes optionally being substituted by heteroatoms.

16. The memory device as claimed in claim 14, wherein the mineral semiconductors are chosen from silicon, germanium, carbon or alloys of the latter, or III-V semiconductor compounds such as GaAs, InP, InSb or alloys of the latter and/or metal oxides, or II-VI semiconductor compounds such as CdTe, or alloys of the latter and/or metal oxides.

17. The memory device as claimed in claim 1, wherein the charge storage molecules are dispersed in an electrolytic layers.

18. The memory device as claimed in claim 1, wherein the molecules capable of storing the charges are arranged in geographically separated regions.

19. The memory device as claimed in claim 18, wherein the molecules capable of storing charges are separated by deposition, creating discrete trapping sites.

20. The memory device as claimed in claim 1 the deposition or the control dielectric comprises a cationic electrolytic polymer.

21. The memory device as claimed in claim 20, wherein the cationic electrolytic polymer is chosen from polyethyleneimine, polyallylamine, various quaternized forms of polyvinylpyridine, soluble and cationic precursors of polyparaphenylenevinylene and derivatives thereof substituted on the ring or the ethylenic bond.

22. The memory device as claimed in claim 1, wherein deposition or the control dielectric comprises at least one layer of, preferably cationic, surfactant, more preferably dimethyldioctadecylammonium bromide.

23. The memory device as claimed in claim 1, wherein deposition or the control dielectric comprises a layer comprising at least one electrolyte polymer and at least one surfactant.

24. A process for fabricating a charge storage memory device such as defined in claim 1 wherein the charge storage molecules are deposited on a surface of said device.

25. The process as claimed in claim 24, wherein the surface is treated prior to the deposition of the charge storage molecules using a process for preparing said surface chosen from pickling, surface activation, irradiation, heating, sensitization of the surface, oxidation of the surface, reduction of the surface, hydration, deposition of binder compound intended to be eliminated, at least party, during the deposition of said molecules.

26. An electronic instrument containing at least one charge storage memory device such as defined in claim 1.

27. The use of a polyoxometallate to produce, in a memory device such as defined in claim 1, variations in the amounts of charge that are sufficiently large to obtain an electric memory effect that can be used in DRAM and flash memory applications.

* * * * *